United States Patent
Kabasawa et al.

(10) Patent No.: US 7,351,987 B2
(45) Date of Patent: Apr. 1, 2008

(54) IRRADIATION SYSTEM WITH ION BEAM

(75) Inventors: Mitsuaki Kabasawa, Ehime (JP);
Mitsukuni Tsukihara, Ehime (JP);
Hiroshi Sogabe, Ehime (JP)

(73) Assignee: SEN Corporation, An Shi and Axcelis Company, Tokyo (JP)

( * ) Notice: Subject to any disclaimer, the term of this patent is extended or adjusted under 35 U.S.C. 154(b) by 210 days.

(21) Appl. No.: 11/202,100

(22) Filed: Aug. 12, 2005

(65) Prior Publication Data

US 2006/0113466 A1    Jun. 1, 2006

(30) Foreign Application Priority Data

Nov. 30, 2004    (JP)    ............... 2004-347499

(51) Int. Cl.
*G21K 5/10*    (2006.01)
(52) U.S. Cl. ............... 250/492.21; 250/492.1; 250/492.23; 250/492.3
(58) Field of Classification Search ........... 250/492.21, 250/290
See application file for complete search history.

(56) References Cited

U.S. PATENT DOCUMENTS

| | | | |
|---|---|---|---|
| 4,985,634 A * | 1/1991 | Stengl et al. ............ 450/492.2 |
| 5,087,815 A * | 2/1992 | Schultz et al. ............... 250/309 |
| 5,134,301 A * | 7/1992 | Kamata et al. ........... 250/492.2 |
| 5,300,191 A * | 4/1994 | Lindberg ...................... 162/31 |
| 6,093,456 A * | 7/2000 | England et al. ............. 427/523 |
| 7,064,491 B2 * | 6/2006 | Horsky et al. .......... 315/111.81 |
| 2004/0119025 A1 * | 6/2004 | Klepper et al. ............. 250/424 |
| 2006/0043316 A1 * | 3/2006 | Liebert et al. ......... 250/492.21 |

FOREIGN PATENT DOCUMENTS

JP    2003-288857 A    10/2003

* cited by examiner

*Primary Examiner*—Jack I. Berman
*Assistant Examiner*—Andrew Smyth
(74) *Attorney, Agent, or Firm*—Arent Fox, LLP.

(57) ABSTRACT

An irradiation system comprises a beam generation source, a mass analysis device, a beam transformer, a deflector for scanning which swings the beam reciprocally, a beam parallelizing device, an acceleration/deceleration device, and an energy filtering device. According to this invention, a hybrid angular energy filter generating both electric and magnetic fields to bend trajectories is provided as the energy filtering device. A pair of multi-surface energy slit units each having a plurality of energy slits that are switchable therebetween depending on an ion species for irradiation are further provided on a downstream side of the hybrid angular energy filter. It is possible to selectively irradiate a target wafer with high-current beams from low energy to high energy in the conditions where contamination such as neutral particles, different kinds of dopants, ions with different energies, metal, and dust particles is extremely small in amount.

13 Claims, 19 Drawing Sheets

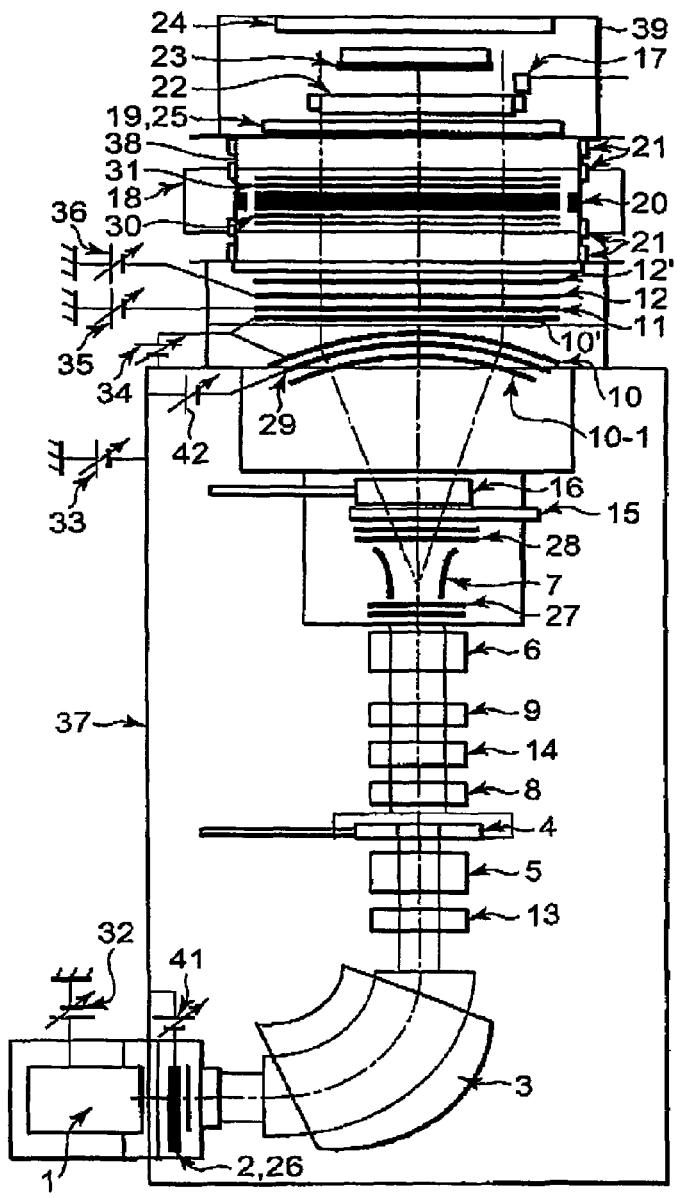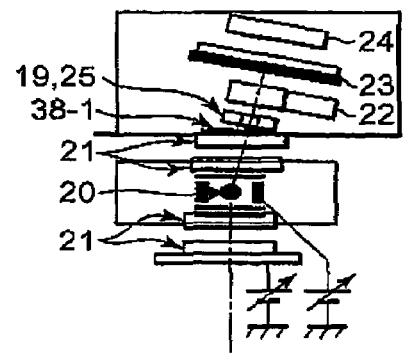
FIG. 5B
FIG. 5A

BOTH-POLARITY A/D COLUMN HIGH-VOLTAGE
POWER SUPPLY COMPATIBLE WITH POSITIVE AND
NEGATIVE CURRENTS IN OPPOSITE DIRECTIONS

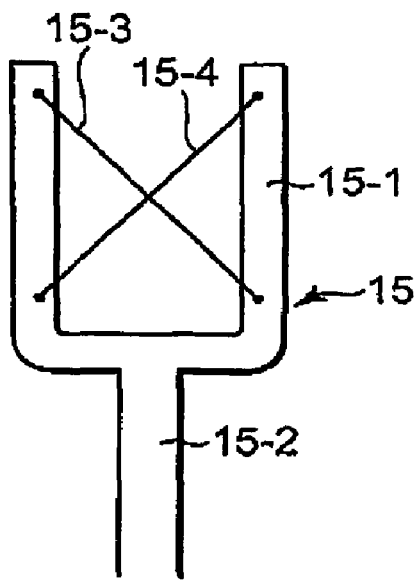
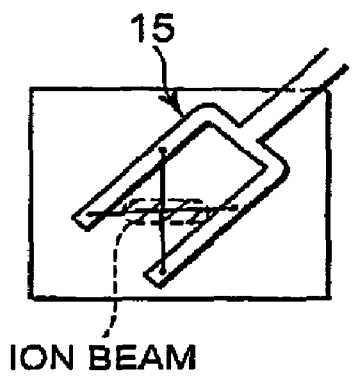
FIG. 15A     FIG. 15B
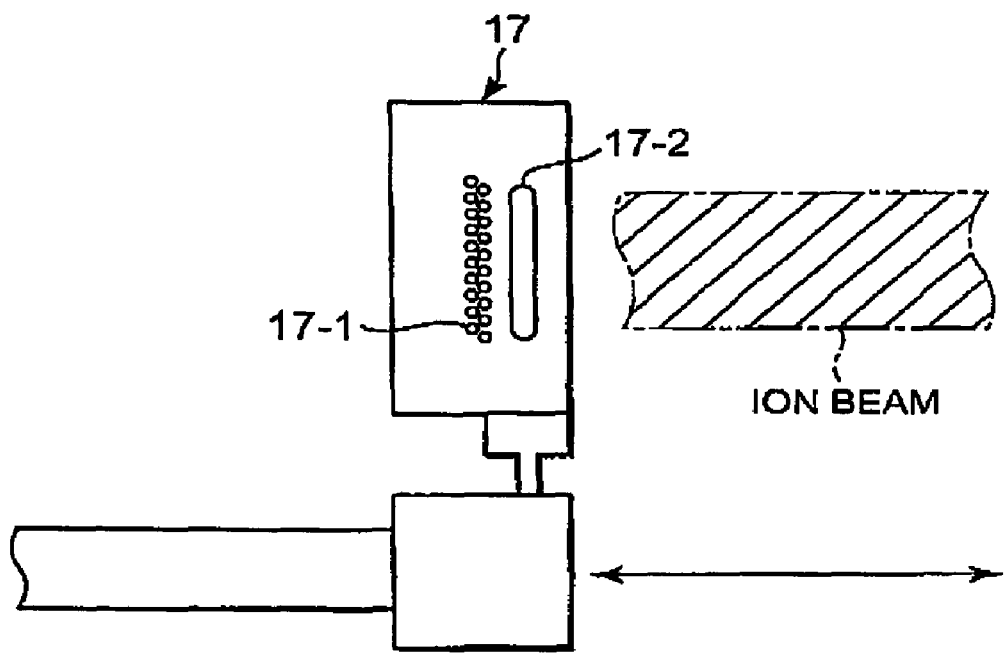
FIG. 16

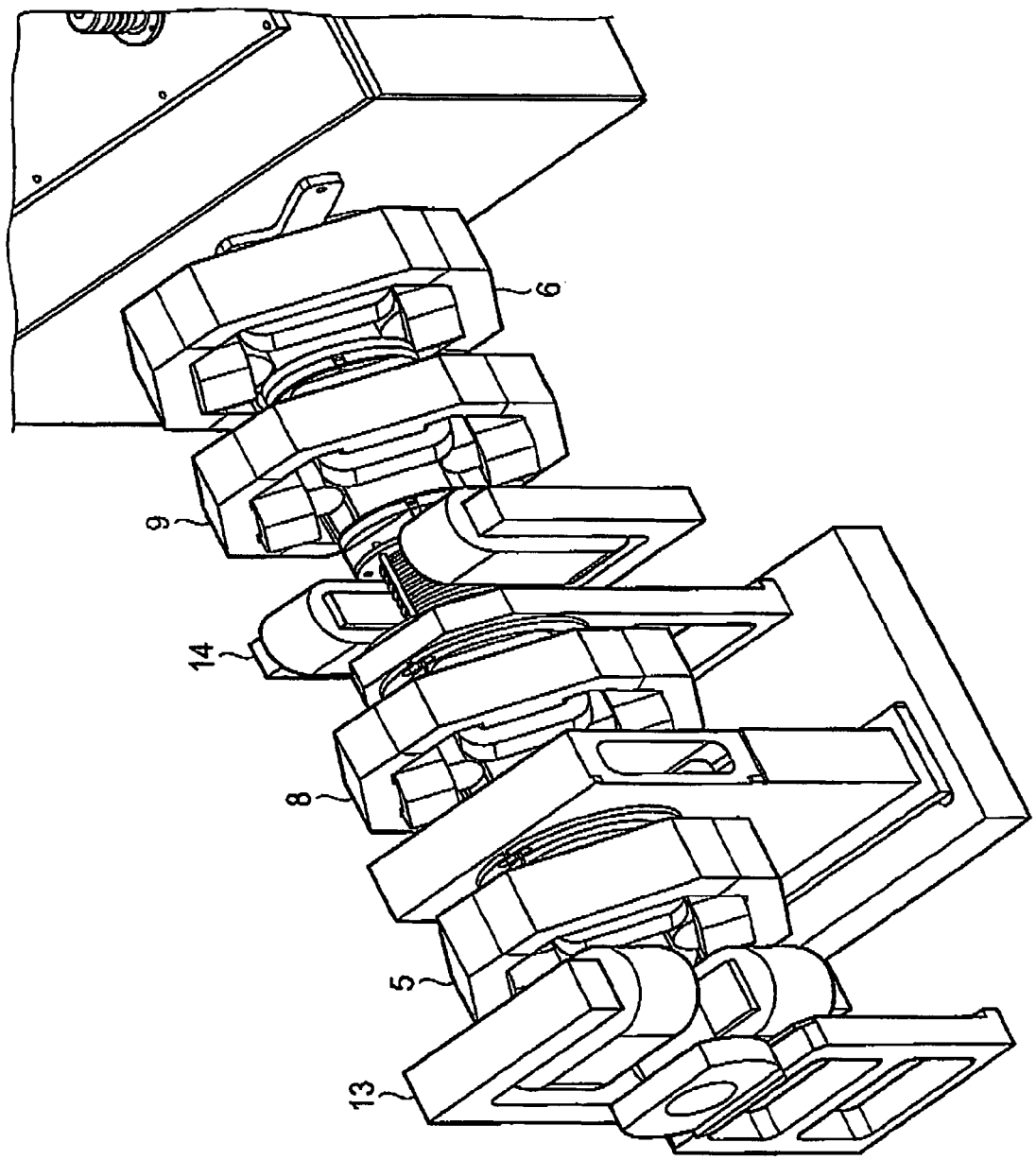

VOLTAGE APPLIED TO EACH PORTION AND BEAM ENERGY

UPWARD ARROW REPRESENTS +VOLTAGE
DOWNWARD ARROW REPRESENTS VOLTAGE
ND REPRSENTS DECELERATION RATIO OF DECELERATION P-LENS

BEAM ENERGY UPON PASSING THROUGH EACH PORTION IS
A DIFFERENCE BETWEEN ENERGY REFERENCE LINE (DOTTED LINE)
AND APPLIED VOLTAGE (SOLID LINE)

IRRADIATION SYSTEM WITH ION BEAM

This application claims priority to prior Japanese patent application JP 2004-347499, the disclosure of which is incorporated herein by reference.

BACKGROUND OF THE INVENTION

This invention relates to an improvement in an irradiation system with an ion beam, such as an ion implantation system. In the ion implantation system, an irradiation target is a wafer made of silicon on GaAs.

Following shrinkage of semiconductor devices, great importance has been placed on ion implantation accuracy even in a high-current ion implantation process. Conventionally, it has been sufficient that variation in the number (dose) of implanted ions is 1% or less in the surface of a target wafer and among targets wafer to wafer. However, in the most advanced process, it is required to control, in addition to the dose accuracy, ion implantation angle accuracy and energy accuracy at low energy. Factors that reduce the implantation angle accuracy are classified as follows.

(1) A center axis of an ion beam (hereinafter abbreviated as a "beam") actually transported has an angle with respect to a designed center trajectory. This is called a center trajectory deviation, (2) Inside a beam as a group of ions, variation in advancing direction of individual ions with respect to a center trajectory of the beam becomes large. This refers to an increase in beam divergence angle.

(3) In a batch ion implantation system, in the case of an implantation angle at the center of a target wafer is set at a value where a rotation axis of a disk mounted with the wafers thereon and the designed center axis of a beam are not parallel to each other, the implantation angles on the left and right sides of the wafer become different from a set value thereof due to rocking motion of the wafer with respect to the beam center axis. This is called an implantation angle deviation.

Among them, items (1) and (3) break fourfold asymmetry of a device character. This increases variation in device performance and extremely lowers yield of the most advanced devices. The beam divergence angle in item (2) serves to weaken the influence of items (1) and (3) when it is small. However, If the beam divergence angle is too large, distribution of dopants in a lateral direction is increased so that the size of a basic device structure become different from designed and therefore the device performance is degraded.

In order to solve the problem of item (1) in the batch ion implantation system, it is necessary to rotate the wafers and perform the ion implantation from four directions with respect to the designed beam axis. In this method, however, it is necessary to divide an otherwise one-time implantation operation Into four-time implantation operations and turn all the ten-odd wafers by 90° for each implantation operation. Therefore, the productivity (throughput) is extremely lowered.

The problem of item (3) can be avoided by arranging the rotation axis of the disk and the beam center axis to be parallel to each other and by setting the wafer on the disk with a specific offset angle. However, there is no flexibility in implantation angle (tilt angle). Although it is possible to manufacture a disk with a small implantation angle deviation, as another solution for item (3), the wafer cooling performance of such a disk necessarily becomes insufficient Therefore, in the batch high-current ion implantation system, it is impossible to enhance the accuracy of implantation angle without degrading the current performance of the system.

In addition to the above, the following points are cited as defects of the batch ion implantation system.

(A) It is not possible to carry out ion implantation at a large implantation angle exceeding 7°.

(B) Following high-speed rotation of the disk with the wafers mounted thereon, there is a possibility that a structure of the surface of each wafer is damaged due to particles moving on the wafer.

(C) Since it is invariably necessary to load ten-odd wafers per batch, a number of dummy wafers are required even when a small number of wafers are processed.

(D) Elastomer (rubber) is used as thermal conductor between a wafer and the cooled disk. Since the elastomer is easy to be pared by confacting a lot of wafers, a particle contamination amount is large on the back of each wafer.

The batch ion implantation system has a big merit that the beam utilization efficiency is high and the productivity is quite high. However, it can no longer be used as the high-current ion implantation system that is required to have high accuracy for coping with the device shrinkage.

Herein below, description will be given about first to third examples of a conventional single-wafer ion implantation system in place of the batch ion implantation system. The first example is a ribbon beam type single-wafer high-current ion implantation system, the second example is a two-dimensional mechanical scan type single-wafer high-current ion implantation system, and the third example is a beam scan type single-wafer middle-current ion implantation system. Note that the beam scan type single-wafer high-current ion implantation system which here we offer has not yet been proposed.

Referring to FIGS. 1 and 2, the ribbon beam type single-wafer high-current ion implantation system will be described.

In FIG. 1, a beam extracted from an ion source 101 through an extraction electrode 102 is subjected to a mass analysis in a dipole magnet 103. After the mass analysis, the beam diverges horizontally. The divergent beam passes through an acceleration/deceleration column electrode portion 104 and then is again focused and parallelized by a dipole magnet 105 also serving for parallelization and filtering, so as to be formed into a ribbon beam. The ribbon beam has a sheet-like cross-sectional shape and therefore is also called a sheet beam. At any rate, the ribbon beam has a beam section with a horizontal width greater than the wafer size and with a vertical width much smaller than the wafer size.

Here the direction of "horizontal" axis is defined as that is on the horizontal (dispersive) plane formed by the beam center trajectory in the mass-analysis magnet and that is perpendicular to the beam center trajectory. The "vertical" axis is perpendicular to both the horizontal plane and the beam center trajectory. The "longitudinal" axis is parallel to the beam center trajectory. Both the horizontal axis and the vertical axis are on the "transverse" plane. Although the scanning direction may different from the horizontal direction, for convenience, the scanning direction is regarded as the horizontal direction in the following description.

Ion implantation is carried out by fixing a beam while mechanically moving a wafer upward and downward by the use of a platen 106. A low-energy beam is obtained by extracting and transporting a beam at high energy and decelerating it at a deceleration stage 107 installed near the wafer.

The ion implantation system of the first example has the following advantages.

The space-charge effect (repulsion between ions) causing a reduction in low-energy beam current is proportional to a beam density. Since the ribbon beam has a large cross-sectional area, insofar as the beam current is the same, the beam density becomes lower as compared with the other types. On the other hand, if the transportable beam density is the same, the beam current becomes larger.

However, the ion implantation system of the first example has the following defects.

Uniformity of the beam density in the horizontal direction, as it is, represents dose uniformity in the horizontal direction. It is quite difficult to achieve a beam density non-uniformity of 1% or less. Particularly at low energy, the beam diverges naturally due to the space-charge effect and therefore it is almost impossible to control the beam density.

Further, since the beam is decelerated near the wafer, beam ions neutralized before the deceleration due to interaction with a plasma shower gas or a resist out-gas are implanted as they are without being decelerated. Such beam ions become energy contamination. Further, since such beam ions are not measured as beam current, there also occurs an error in dose (overdose).

Further, those ions, that are neutralized due to collision with the gas while the beam is passing through the parallelizing electromagnet 105 become uncertain in deflection angle and are therefore implanted into a wafer 108 at abnormal implantation angles as shown in FIG. 2 by arrows. This is caused by the fact that the sheet plane of the ribbon beam and the deflection plane (the beam trajectory plane in the parallelizing electromagnet 105) coincide with each other in the horizontal plane.

After all, like the foregoing batch ion implantation system, the ribbon beam type single-wafer high-current ion implantation system is high in productivity because its beam current is large, but poor in implantation accuracy.

Referring to FIG. 3, the two-dimensional mechanical scan type high-current ion implantation system will be described.

In FIG. 3, a beam extracted from an ion source 201 through an extraction electrode 202 is subjected to a mass analysis in a mass analysis electromagnet device 203. After the mass analysis, a wafer on a platen 206 is irradiated with the beam through a differential lens 205. In this example, the beam is fixed and ion implantation is performed over the whole surface of the wafer by mechanical scanning, i.e. by mechanically moving the wafer vertically and horizontally by the use of the platen 206. The cross-sectional size of the beam is much smaller than the wafer size in both vertical and horizontal directions. In the case of extremely low energy implantation, a decelerated beam is used.

The ion implantation system of the second example has the following advantages.

A relatively large amount of the beam current is obtained at low energy.

A beam line from the ion source 201 to the platen 206 is short and the ion implantation system is offered at a relatively low price.

However, the ion implantation system of the second example has the following defects.

The defects inherent to the beam line of the batch ion implantation system, such as the beam axis deviation, the increase in beam divergence angle at low energy, and the generation of energy contamination in deceleration of the beam, are inherited as they are.

Since a scanning frequency cannot be set high but can only be set to about 1 Hz in the mechanical scanning, the scan times that the beam passes through each point on the wafer per unit time is small. In order to suppress no uniformity of dose in the surface of the wafer to 1% or less, the scan times should be set to about 100. In order to achieve it in a system using a low scanning frequency, a beam should be intentionally reduced so as to prolong an Implantation time. That is, the productivity should be sacrificed for enhancing the dose accuracy.

After all, the two-dimensional mechanical scan type high-current ion implantation system is low in productivity and also not good in implantation angle accuracy.

Referring to FIGS. 4A and 4B, the beam scan type middle-current ion implantation system will be described. Top view of the system is shown in FIG. 4A and side view is in FIG. 4B. Such a middle-current ion implantation system is disclosed in, for example, JP-A-2003-288857.

In FIG. 4A, ions generated in an ion source 301 are extracted as an ion beam 302 through an extraction electrode (not illustrated). The extracted beam 302 is subjected to a mass analysis in a dipole electromagnet 303 so that only a necessary ion species is selected. The ion beam 302 composed of only the necessary ion species is supplied into a beam transformer 304 where the cross-sectional shape of the beam 302 is adjusted to the beam transportation line. The beam transformer 304 is formed by a magnetic Q (Quadrupole) lens, an electrostatic Q (Quadrupole) lens, or the like. The beam having the appropriate cross-sectional shape is deflected by a scanner 305 in a plane parallel to the sheet surface of FIG. 4A.

The scanning beam is parallelized by a parallelizing-lens (hereinafter referred to as "P-lens") 306 so as to be parallel to an axis of a deflection angle of 0°. In FIG. 4A, a scan range of the beam by the scanner 305 is indicated by thick black lines and a broken line. The beam from the P-lens 306 is sent to an angular energy filter 308 (hereinafter also referred to as an "AEF") through one or more acceleration/deceleration column electrodes 307. The angular energy filter 308 performs an analysis about energy of the ion to thereby select only an ion species with necessary energy. As shown in FIG. 4B, only the selected ion species is deflected slightly downward in the angular energy filter 308. The beam composed of only the thus selected ion species is transported to a wafer 310 through a plasma electron flood system 309. The beam that is not injected to the wafer 310 is incident on a beam stopper 311 so that energy thereof is consumed. Normally, the structure from the ion source 301 to a vacuum process chamber where the wafer 310 is accommodated is called a beam line.

In this type of the ion implantation system, the beam extracted from the Ion source 301 is, after the mass analysis, deflected horizontally at a scanning frequency of several hundreds of Hz to several KHz by the scanner 305 and then parallelized by the P-lens 306. The cross-sectional size of the beam is much smaller than the size of the wafer 310 and the beam scan range in the horizontal direction is set greater than the wafer 310. With respect to the vertical direction, mechanical scanning is implemented to move the wafer 310 like in the ribbon beam type. After the parallelization, the beam is accelerated or decelerated by the acceleration/deceleration column electrode or electrodes 307 so as to cover a wide energy range of 5 keV to 260 keV. By performing the energy analysis through the angular energy filter 308 in the form of an electric field or a magnetic field after the acceleration or deceleration, the pure beam can be implanted into the wafer 310. Although not illustrated, energy slits are Installed on the downstream side of the angular energy filter 308.

The ion implantation system of the third example has the following advantages.

The beam parallelism can be measured so that the implantation angle In the horizontal direction can be set uniformly over a wafer with high accuracy.

Since the scanning frequency is high, high dose uniformity can be achieved in the wafer even with the implantation for a short time.

By the use of the angular energy filter 308, all the energy contamination and the major part of particle and metal contamination generated in the beam line are prevented from going toward the wafer.

The parallelization of the beam and the energy filtering for the beam are performed by the different devices so that the beam scan plane (horizontal) and the deflection trajectory plane vertical of the angular energy filter 308 can be set perpendicular to each other. Therefore, a part of the beam that is neutralized while passing through the angular energy filter 308 and coming out from it at abnormal angles cannot pass through the narrow slits in front of a wafer and is therefore prevented from being implanted into the wafer 310.

However, the ion implantation system of the third example has the following defects.

The amount of transportable beam current is small. Particularly at extremely low energy, the beam can hardly be transported.

After all, the beam scan type middle-current ion implantation system enables highly accurate implantation but cannot transport to the wafer a beam current high enough for use in the high-current ion implantation process.

SUMMARY OF THE INVENTION

It is a main object of this invention to provide an irradiation system with ion beam that can reduce contamination.

According to this invention, an irradiation system with ion beam is provided. The irradiation system with ion beam is configured that a beam from a beam generation source is caused to pass through a mass analysis device and a beam transformer, then pass through a deflector for scanning which swings the beam reciprocally, a beam parallelizing device, an acceleration/deceleration device, and an energy filtering device, and then is incident on an irradiation target.

According to the first aspect of this invention, a hybrid angular energy filter generating both electric and magnetic field to bend trajectories is provided as the energy filtering device. A pair of multi-surface energy slit units each having a plurality of energy slits that are switchable therebetween depending on an ion species for irradiation are further provided on a downstream side of the hybrid angular energy filter, thereby making it possible to irradiate the target with pure-energy high-current beams from low energy to high energy in the state where contamination such as neutral particles, different kinds of dopants, metal, and dust particles is extremely small in amount.

In the irradiation system with ion beam according to the first aspect, the energy filtering device deflects the beam in a plane perpendicular to a beam scan plane. Each of the plurality of energy slits is selected corresponding to the ion species for irradiation so that the beam may not hit on a contaminated surface by the other ion species and only such an ion having a required energy may passes with a correct angle.

in the irradiation system with ion beam according to the first aspect, it is preferable that the multi-surface energy slit unit has a three-surface rotatably switching type structure in which the energy slits of three surfaces having one to one correspondence to three kinds of ion species are integrated. Alternatively, the multi-surface energy slit unit may have a four-surface rotatable switching type structure in which energy slits of three surfaces having one to one correspondence to three kinds of ion species and a divergence mask to measure the incident angle and the divergence angle of the parallelized beam are integrated.

In the irradiation system with ion beam according to the first aspect, a rotation-type or linear-type divergence mask may be provided at the down stream side of the energy filtering device.

In the irradiation system with ion beam according to the first aspect, it may further comprise a multi-surface beam dump provided on the downstream side of the irradiation target. The multi-surface beam dump serves to receive a portion of a beam that was not incident on the irradiation target and has a beam current measurement function.

In the irradiation system with ion beam according to the first aspect, the multi-surface beam dump comprises at least one plural-surface structure body having a plurality of surfaces corresponding to the ion species for irradiation, and is configured such that the surfaces of the plural-surface structure body corresponding to the ion species for irradiation are switchable by rotation so as to receive the beam without exposing a contaminated surfaces by other ion species.

In the irradiation system with ion beam according to the first aspect, end portions of the adjacent plural-surface structure bodies of the multi-surface beam dump overlap each other, when receiving the beam, so as to prevent the beam from passing therethrough rearward and hitting on the metal wall.

In the irradiation system with ion beam according to the first aspect, it is preferable that the multi-surface energy silt unit and the multi-surface beam dump are simultaneously changed depending on the ion species to be used for irradiation.

According to the second aspect of this invention, an automatic tuning system applied to the irradiation system with ion beam according to the first aspect is provided. The automatic tuning system is configured such that, in automatic tuning of an energy filtering device and the multi-surface energy slit unit, one of the surface of the multi-surface energy slit unit is selected and the slit width is set, and then the filtering device is finely adjusted.

According to the third aspect of this invention, a few sets of mass analysis slits are provided on the downstream side of the mass analysis device. The number of the sets of mass analysis slits corresponds to the number of ion species for irradiation. Each set of mass analysis slits is integrally composed of three slits including a slit for normal implantation, a slit for high mass resolution and low-dose implantation, and a plate for beam centering with a small-diameter opening. The three slits are switchable therebetween depending on the normal implantation, the high resolution low-dose implantation, and the beam centering. Each set of mass analysis slits is movable horizontally between a mass analysis position and a retreat position and is further movable longitudinally so that the mass analysis position becomes substantially the same for all ion species.

In the irradiation system with ion beam according to the first or third aspect, it is preferable that the beam is modified by the beam transformer in its cross-sectional shape from a circular cross-section or an elliptical or oval cross-section to an elliptical or oval cross-section that is long in a scan direction after deflection for scanning.

In the irradiation system with ion beam according to the first or third aspect, the beam is modified by the beam transformer in its cross-sectional shape from a circular cross-section or an elliptical or oval cross-section to an elliptical or oval cross-section that is long in a scan direction after deflection for scanning. A plurality of apertures and electrodes provided in the beam line downstream of the deflector for scanning are made of graphite, and intervals between the apertures and between the electrodes are set narrow so as to prevent the beam from hitting directly on side walls of vacuum chambers in the beam line and the deflector for scanning.

BRIEF DESCRIPTION OF THE DRAWINGS

FIG. 5A is a diagram showing a schematic structure of an embodiment wherein this invention is applied to an ion implantation system, while FIG. 5B is a side view showing an end part of the structure illustrated in FIG. 5A;

FIG. 9A is a diagram for explaining difference in beam sizes between Inner and outer trajectories when there is no correction by synchronized quadrupole electromagnets in the ion implantation system of FIGS. 5A and 5B, while

FIG. 10A is a diagram for explaining inner and outer beam trajectories when there is no correction by the synchronized quadrupole electromagnets in the ion implantation system of FIGS. 5A and 5B, while

FIGS. 15A and 15B are diagrams showing one example of a front profile monitor in the ion implantation system of FIGS. 5A and 5B;

FIG. 16 is a diagram showing one example of a rear profile monitor in the ion implantation system of FIGS. 5A and 5B;

FIG. 19 is a perspective view showing one example of a combination of four quadrupole electromagnets QD, QF, syQD, and syQF and steering electromagnets STX and STY in the ion implantation system of FIGS. 5A and 5B;

DESCRIPTION OF THE PREFERRED EMBODIMENT

Figure 1:
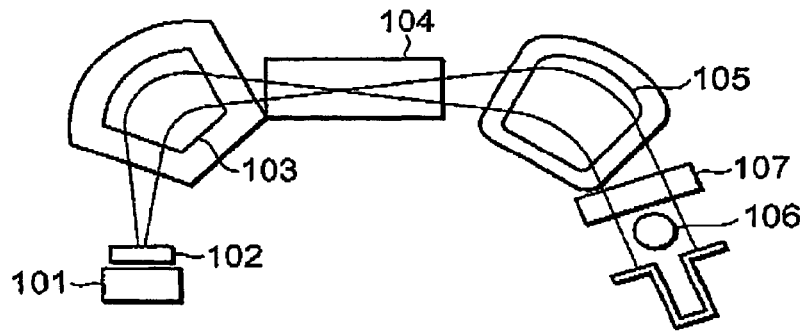
FIG. 1 is a diagram showing a schematic structure of a ribbon beam type single-wafer high-current ion implantation system as a first conventional example.
Figure 2:
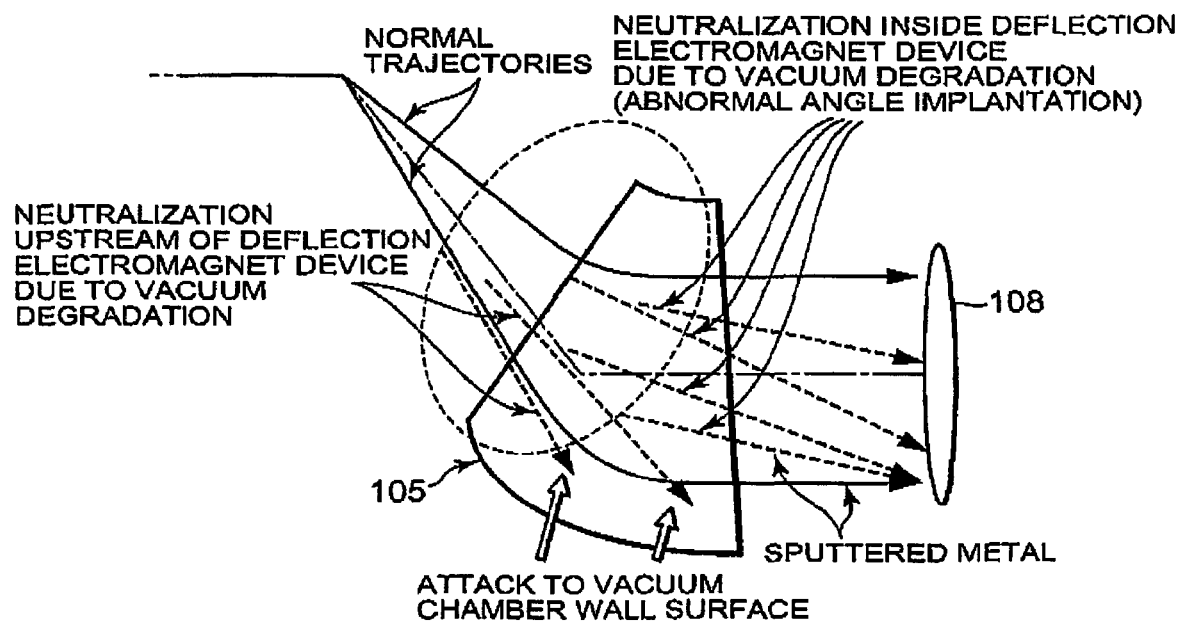
FIG. 2 is a diagram for explaining a mechanism of generation of contamination at an electromagnet, which also serves for beam parallelization and filtering, in the ion implantation system of FIG. 1.
Figure 3:
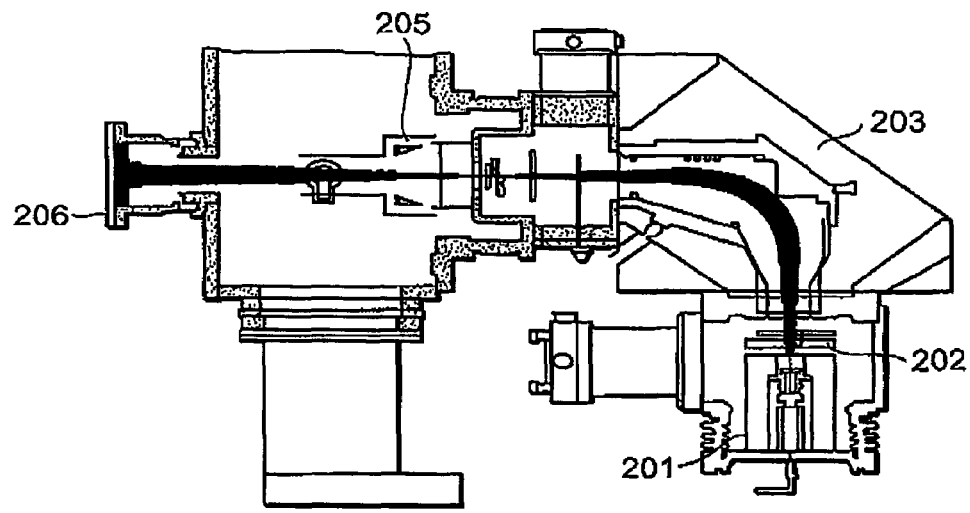
FIG. 3 is a diagram showing a schematic structure of a two-dimensional mechanical scan type single-wafer high-current ion implantation system as a second conventional example.
Figure 4A:
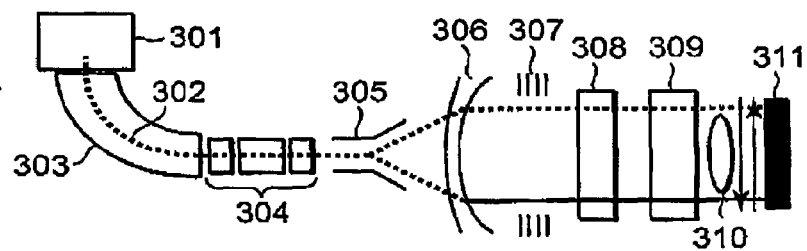
FIGS. 4A and 4B are a plan view and a side view, respectively, showing a schematic structure of a beam scan type single-wafer middle-current ion implantation system as a third conventional example.
Figure 4B:
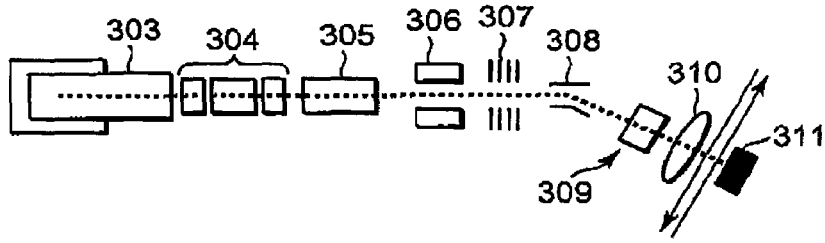

Prior to describing a preferred embodiment of this invention, description will be given hereinbelow about those points that are improved for applying this invention to an ion implantation system.

Note that a "horizontal axis" which will hereinafter be referred to represents one axis in a plane in a direction perpendicular to a beam advancing direction and in a plane formed by trajectories in the mass analysis dipole magnet (dispersive plane). Likewise, a "vertical axis" represents one axis in the plane in the direction perpendicular to the beam advancing direction and perpendicular to the horizontal axis. "A longitudinal direction" represents the beam advancing direction. Thus the "horizontal" and "vertical" do not necessarily refer to the surface of the earth.

By this invention, a high-current beam has become able to be transported while keeping the ability of the beam scan type single-wafer middle-current ion implantation system that enables the ion implantation with high accuracy in order to transport the high-current beam, it is necessary to overcome the space-charge effect. The harmful influence of the space-charge effect is not only to diverge the beam. That is, when the beam is deflected for scanning, the path length of a beam trajectory increases as a scan angle increases. When the path length of the beam trajectory changes, there also arises a difference in a degree of space-charge effect. When the difference in space-charge effect arises on the way of beam transportation, there occurs variation in beam divergence angle and beam size on a wafer. The ion implantation system according to this invention is mounted with a system that corrects it.

Further, the ion implantation system according to this invention is mounted with a system that can enhance an implantation angle accuracy including a vertical implantation angle accuracy that is not considered in the middle-current ion implantation system.

When the beam current becomes high enough, there arise problems such as dose deviation and dose uniformity degradation due to an increase in photo-resist outgassing, electrostatic breakdown of a gate oxide due to wafer charging during implantation, and an increase in metal contamination and contamination of dopants of different kinds due to an increase in beam sputtering product. The ion implantation system according to this invention also takes into account countermeasures against the problems of this kind.

To sum up the foregoing points, the specific measures taken for improvement are as follows.

(1) As a beam extraction system and a mass analysis system, those of the batch high-current ion implantation system is used to enable extraction and mass analysis of a high-current beam.

(2) Between a mass analysis electromagnet device and a scanner (deflector), there are installed a pair of a vertically focusing DC quadrupole electromagnets QD (Quadrupole Defocusing) and a horizontally focusing DC quadrupole electromagnet QF (Quadrupole Focusing). By the use of these electromagnets, a cross-section of a beam at an entrance of the scanner is transformed to an oval or ellipse that is long in the beam scanning direction. Note that the scanner preferably has such an electrode shape that can prevent, as much as possible, its produced electric field from affecting convergence and divergence of the beam having the long cross-section in the scanning direction.

(3) Between the mass analysis electromagnet device and the scanner, a vertically focusing synchronized quadrupole electromagnet syQD (synchronized Quadrupole Defocusing) and a horizontally focusing synchronized quadrupole electromagnet syQF (synchronized Quadrupole Focusing) are installed and operated synchronously with the electric scanner. By the use of these electromagnets, deviations in beam divergence angle and beam size caused by a difference in space-charge effect between a beam trajectory directed toward the center of a wafer (inner trajectory) and each of beam trajectories directed toward left and right ends of the wafer (outer trajectories) is corrected.

(4) An electrostatic deceleration P (Parallelizing)-lens is installed on the downstream side of the scanner, and A/D (Acceleration/Deceleration) column including a pair of electrodes inside to each of which can be supplied positive or negative voltage is installed at the downstream side of the deceleration P-lens. By the use of the deceleration P-lens, the deceleration ratio in ion implantation at low energy can be made relatively small so that divergence of the beam following the deceleration can be suppressed. Further, by taking the balance between a strong convergence force in the vertical direction generated by the deceleration P-lens and a strong convergence force of the A/D column, the beam can be moderately focused toward the wafer with respect to the vertical direction.

(5) Between the mass analysis electromagnet device and the electric scanner, a pair of steering electromagnets STY and STX for vertical direction center trajectory correction and for horizontal direction center trajectory correction are installed in addition, two profile monitors each capable of measuring a beam center position with respect to the vertical and horizontal directions are installed immediately after the scanner and near the wafer, respectively. By combining these monitors, the steering electromagnets STY and STX, a tilt of an extraction electrode (three-axis movable), and fine modulation in deflection angle of the mass analysis electromagnet device and the scanner, a deviation from the designed center trajectory of the beam is eliminated. This makes it possible to enhance an implantation angle accuracy.

(6) A hybrid angular energy filter (hereinafter referred to as an "AEF") is installed between the AID column and the wafer. Generally, the angular energy filter is called an energy filtering device. An energy slit is provided downstream side of the AEF so that only an ion species having a predetermined energy can pass through the energy slit. With this arrangement, energy contamination (neutral particles), metal contamination, particles and so on coming from the upstream side of the beam line are removed.

The hybrid AEF is an energy filtering device that can produce both an electric field and a magnetic field, and uses the magnetic field for ion implantation at low energy and mainly the electric field for ion implantation at high energy. Since electrons cannot enter an AEF region with the electric field, a strong divergence force caused by repulsion between positively charged ions occurs in the beam (space-charge effect). Therefore, if the electric field is used in the ion implantation at low energy, the beam current becomes almost zero. On the other hand, since the magnetic field AEF traps electrons, the positive charge of the beam is canceled so that the space-charge effect is largely weakened. However, since it is necessary to generate a magnetic field parallel to a beam scan plane (horizontal plane), a pole gap of an AEF deflection electromagnet becomes quite large so that a strong magnetic field cannot be generated. Therefore, the AEF cannot deflect high-energy ions by a simple use of the magnetic field.

The hybrid AEF is an energy filtering device that compensates demerits possessed by the electric field AEF and the magnetic field AEF, and can also transport a low-energy high-current beam without degrading the primary function of transporting a high-purity beam to the wafer.

The magnetic field AEF has a structure with a small leakage magnetic field so as not to disturb the motion of low-energy electrons that is necessary for preventing electrostatic charging of the wafer.

The hybrid AEF is, specifically, formed by an AEF deflection electromagnet and an AEF deflection electrode. Since a scan plane (horizontal plane) and a deflection plane (vertical plane or vice versa) are perpendicular to each other, filtering can be performed at a small bending angle. Therefore, even if neutral particles are generated by charge exchanging reactions between beam ions and residual gas atoms during deflection of the beam, those neutral particles are not implanted into the wafer at abnormal angles.

(7) A plasma shower system (an AEF plasma shower) is provided on the center axis of the magnetic field of the hybrid AEF. Electrons are supplied from the AEF plasma shower into a region between the A/D column and the AEF and into the magnetic field region of the hybrid AEF so as to reduce the space-charge effect, thereby enabling transportation of the low-energy high-current beam. A plurality of permanent magnets are mounted on inner walls of an AEF vacuum chamber so as to form a cusp magnetic field, thereby increasing the electron confining efficiency.

(8) In order to prevent electrostatic charging of the wafer and, simultaneously, supply electrons to the beam between the AEF and the wafer to compensate ions positive charge, a plasma shower is installed on the downstream side of the AEF, separately from the foregoing AEF plasma shower.

(9) In order to prevent metal contamination, those portions such as the slits and a beam dump where the beam hits are all made of graphite. Further, in order to prevent the beam having the horizontally long cross-section from hitting on the walls, the width of each of an electrode opening, a vacuum chamber (made of aluminum), and so on in a region from the deceleration P-lens to the energy slit is set equal to or greater than (beam scan range)+2×(beam width).

In order to prevent cross-contamination (contamination by different dopant species), each of the energy slit and the beam dump where is near the wafer and a lot of beam ions hit has a pair of rotation-type multi-surface structures wherein one surface corresponds to one ion species exclusively and is automatically switched when the implanted ion species is changed.

(10) By the use of the divergence mask (one surface of the energy slit unit) and a rear profile monitor near the wafer, it is made possible to confirm that an incident angle formed between the beam center axis and the wafer surface is constant over all the scan region in the horizontal (scanning) direction, Simultaneously, it is made possible to measure a divergence angle of the beam in the horizontal direction. When these are insufficient, voltages of the P-lens, and the steering electromagnets STX and STY, coil currents of quadrupole magnets QD, QF, syQD and syQF are finely adjusted.

(11) Electron suppression electrodes are installed before and after a positive-voltage electrode that absorbs electrons and before lower voltage side of electrodes that can produce an electric field of accelerating electrons. This shortens regions where electrons for compensating space charge are insufficient.

(12) A connection manner of high-voltage power supplies are configured such that implantation energy is determined only by a high voltage applied to the ion source. Further, the high-voltage power supply of the ion source is divided into one for higher energy and the other for lower energy which are used by switching therebetween. In this manner, by dividing the dynamic range and using highly accurate high-voltage sources, respectively, the implantation energy accuracy is ensured all over the region. Further, since the implantation energy is determined only by the high-voltage power supply of the ion source, the accuracy of other high-voltage power supplies such as the deceleration P-lens power supply, the A/D column power supplies, and the terminal power supply is not strictly required.

(13) When a large amount of gas is generated from a photoresist on the wafer during ion implantation using a high-current beam, charge exchanging reactions occur between the gas molecules and beam ions so that some portion of the ions are neutralized and cannot be measured as a beam current. In order to prevent a dose error from increasing by this phenomenon, there is introduced a pressure compensation system for correcting a measured beam current by the measured pressure in a process chamber (vacuum process chamber).

Referring now to FIGS. 5A and 5B, description will be given about an embodiment wherein this invention is applied to a single-wafer ion implantation system. The explanation starts from an ion source 1 to the downstream. The structure of this ion implantation system is as follows. An extraction electrode 2 is provided on an outlet side of the ion source 1. A mass analysis electromagnet device 3 is installed on the downstream side of the extraction electrode 2. On the downstream side of the mass analysis electromagnet device 3, there are installed a steering electromagnet STX 13 for horizontal direction center trajectory correction, the vertically focusing DC quadrupole electromagnet QD 5, a horizontally focusing synchronized quadrupole electromagnet syQD 8, a steering electromagnet STY 14 for vertical direction center trajectory correction, a horizontally focusing synchronized quadrupole electromagnet syQF 9, and a horizontally focusing DC quadrupole electromagnet QF 6, in the order named. Further, an electron suppression electrode 26 is provided near the extraction electrode 2 on its downstream side and a three-stage selectable mass analysis slit 4 is installed between the DC quadrupole electromagnet QD 5 and the synchronized quadrupole electromagnet syQD 8.

On the downstream side of the DC quadrupole electromagnet QF 6, a scanner (deflector) 7 is installed. Electron suppression electrodes 27 and 28 are installed on the upstream and downstream sides of the scanner 7, respectively. On the downstream side of the electron suppression electrode 28, a front profile monitor 15 and an injection Faraday cup 16 are installed in the order named.

The components from the extraction electrode 2 to the injection Faraday cup 16 are accommodated in a terminal 37 and a high voltage is applied to the terminal 37.

On the downstream side of the injection Faraday cup 16, there are Installed a front curved aperture 10-1, an electrostatic deceleration P-lens (parallelizing lens) 10, a deceleration P-lens outlet-side electrode 10', a first A/D column electrode 11, a second A/D column electrode 12, and a hybrid AEF 15, in the order named. The front curved aperture 10-1 is for shaping the beam. In this embodiment, although the electrostatic deceleration P-lens is illustrated by a single electrode 10 in FIG. 5A, the electrostatic deceleration P-lens is implemented by two electrodes depicted at 10 and 29. Particularly, the upstream side electrode of these two electrodes is arranged so as to be used as an electron suppression electrode 29. The reason why the electrode 29 is called the electron suppression electrode will be described later in the following description, it should be noted that the electrostatic deceleration P-lens 10 includes the electron suppression electrode 29. At any rate, although a conventional deceleration P-lens requires four electrodes, the deceleration P-lens 10 in this embodiment requires only two electrodes. The four electrodes 10', 11, 12, 12' and their insulators form the A/D column.

The AEF 18 has electron suppression electrodes 30 and 31 on its upstream and downstream sides, respectively. The AEF 18 is further provided with AEF plasma showers 20 on both horizontal sides thereof. A plurality of permanent magnets 21 are installed on walls of an AEF chamber 38 to thereby form cusp magnetic fields for confining plasma. In order to form the cusp magnetic fields, the permanent magnets 21 are installed with their magnetic poles directed toward the inside of the AEF chamber 38 and with the polarity of the adjacent magnets being opposite to each other. On an outlet side of the AEF chamber 38 is provided a striker plate 38-1 for receiving metal atoms, particles, and so on that are not deflected by the AEF 18 but go straight on.

The AEF chamber 38 is connected to a process chamber (vacuum process chamber) 39 in the process chamber 39, a combined structure of a triple-surface energy slit unit 19 and a divergence mask 25, a plasma shower 22, a wafer 23, and a triple-surface beam dump 24 are installed in the order named. A rear profile monitor 17 is arranged at the side of the wafer 23 so as to be inserted into and pulled out of a scan range. Needless to say, chambers along the inside of the beam line are maintained at a high vacuum.

Connection manners of various power supplies to the foregoing respective components are as follows.

An ion source high-voltage power supply 32 is connected between the ion source i and ground, and an electron suppression power supply 41 is connected between the extraction electrode 2 and the terminal 37. A terminal high-voltage power supply 33 is connected between the terminal 37 and ground, and a suppression power supply 42 is connected between the terminal 37 and the electron suppression electrode 29. This is the reason why the electrode 29 is called the electron suppression electrode. A P-lens high-voltage power supply 34 is connected between the terminal 37 and each of the electrostatic deceleration P-lens 10 and its outlet-side electrode 10', A first A/D column high-voltage power supply 35 is connected between the first A/D column electrode 11 and ground, and a second A/D column high-voltage power supply 36 is connected between the second A/D column electrode 12 and ground. Actually, as will be described later, each of the first A/D column high-voltage power supply 35 and the second A/D column high-voltage power supply 36 is capable of applying either a positive or negative voltage by switching between two power supplies.

Now, description will be given about specific structures and functions of the foregoing respective components.

[Ion Source 1, Extraction Electrode 2, Mass Analysis Electromagnet Device 3, Three-Stage Selectable Mass Analysis Slit 4]

These are basically the same as those used in the batch high-current ion implantation system, thereby enabling extraction and mass analysis of a high-current beam. Nevertheless, the extraction electrode 2 has a three-axis adjustment structure capable of adjusting a longitudinal position (gap axis), a horizontal position ("side" axis), and a vertical angle ("tilt" axis). The longitudinal and horizontal position adjustment is used simply for high-current beam extraction, and the vertical angle adjustment is used for centering of the beam.

Figure 6:
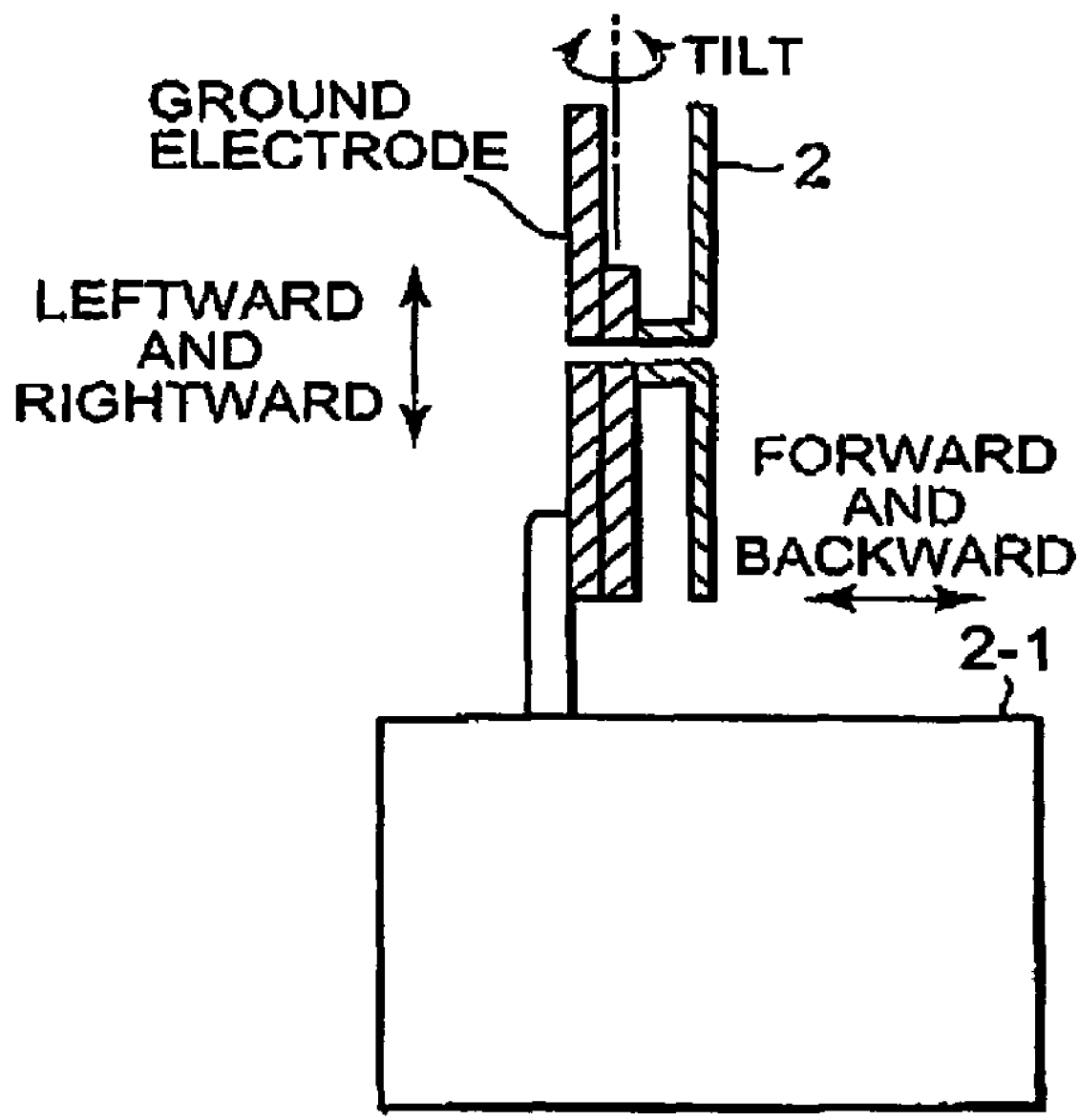
FIG. 6 is a diagram for explaining a mechanism that enables an extraction electrode in the ion implantation system of FIGS. 5A and 5B to move with respect to three axes.

As shown in FIG. 6, the extraction electrode 2 is configured to be movable forward and backward along the "gap" axis, movable leftward and rightward along the "side" axis, and tiltable forward and backward around the horizontal tilt axis by a three-axis drive mechanism 2-1.

Figure 7:
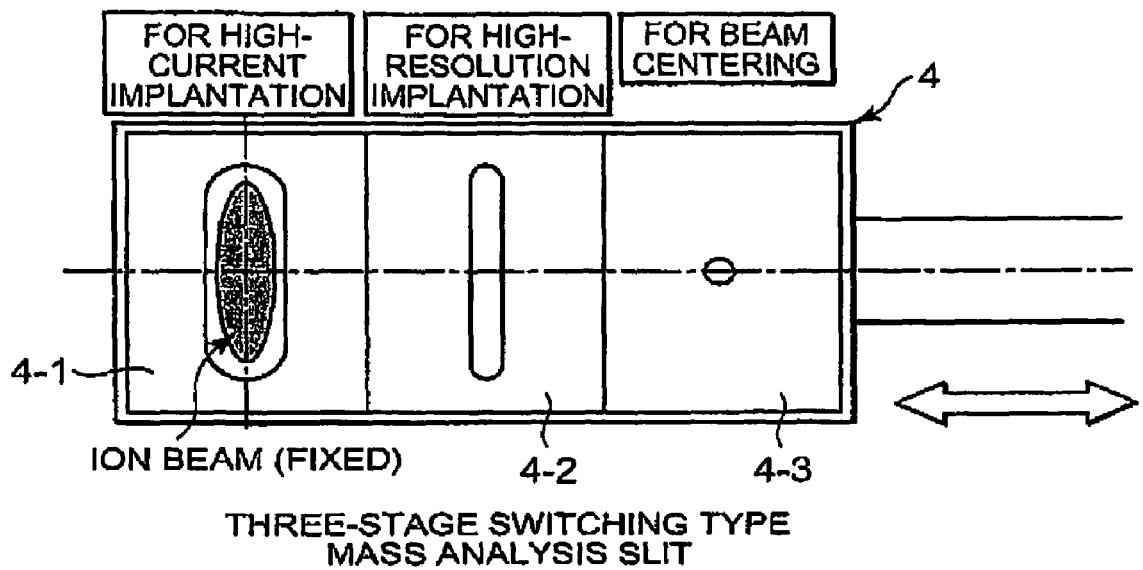
FIG. 7 is a diagram showing one example of a mass analysis slit used in the ion implantation system of FIGS. 5A and 5B.

The mass analysis slit 4 is of the three-stage automatic selectable type. Specifically, as shown in FIG. 7, the mass analysis slit 4 is selectable, depending on a use, among a normal high-current implantation slit 4-1, a high-resolution and low-dose implantation slit 4-2, and a hole 4-3 for beam centering. The high-current implantation slit 4-1 has a mass resolution of about 50 and is capable of separating 50 amu ions and 51 amu ions. On the other hand, the high-resolution and low-dose implantation slit 4-2 has a mass resolution of about 200. Note that the position of a beam when passing through the mass analysis slit 4 is fixed.

[Vertically Focusing DC Quadrupole Electromagnet QD 5, Horizontally Focusing DC Quadrupole Electromagnet QF 6, Scanner 7]

By the use of the DC quadrupole electromagnet QD 5 and the DC quadrupole electromagnet QF 6, a cross-section of the beam on the downstream side of the scanner 7 is transformed to an oval that is long in the scanning (horizontal) direction. On the downstream side of the scanner 7, since the beam trajectories are moving horizontally, a beam passing region in the horizontal direction is very wide and therefore an device for horizontally focusing the beam cannot be installed. Therefore, on the downstream side of the scanner 7, it is necessary to prevent a beam defocusing force caused by the space-charge effect from generating so much in the horizontal direction. This is realized by forming the cross-section of the beam into the shape that is long in the horizontal direction.

Magnitudes Kx and Ky (inverse number of focal length) of beam defocusing forces in the horizontal direction and in the vertical direction caused by the space-charge effect can be approximated by the following formulas (1-1) and (1-2), respectively.

$$K_x = -\frac{qm^{0.5}I}{\sqrt{2}\,\pi\varepsilon_0 E_B^{1.5}} \frac{1-\eta}{\sigma_x(\sigma_x+\sigma_y)} \quad (1\text{-}1)$$

$$K_y = -\frac{qm^{0.5}I}{\sqrt{2}\,\pi\varepsilon_0 E_B^{1.5}} \frac{1-\eta}{\sigma_y(\sigma_x+\sigma_y)} \quad (1\text{-}2)$$

In the formulas (1-1) and (1-2), $\epsilon_0$ is a dielectric constant in vacuum, q is a charge of an ion, m is a mass of an ion, $E_B$ is a beam energy, I is a beam current, and $\eta$ is a space-charge neutralization coefficient ($0 \leq \eta \leq 1$, $\eta=0$ represents an electron lacking state and $\eta=1$ represents a completely compensated state). Further, a horizontal beam size is given by 2 $\sigma x$ while a vertical beam size is given by 2 $\sigma y$.

It is understood from these formulas that when the horizontal beam size 2 $\sigma x$ is sufficiently greater than the vertical beam size 2 $\sigma y$, the magnitude Kx of the beam defocusing force in the horizontal direction becomes much smaller than the magnitude Ky of the beam defocusing force in the vertical direction.

It is desirable that the DC quadrupole electromagnets QD 5 and QF 6 are installed at optimal positions of respectively, according to vertical and horizontal beam sizes of 2 $\sigma_x$ and 2 $\sigma_y$. The optimal position for QD 5 is such a position as vertical beam size becomes maximum and horizontal beam size becomes minimum. The optimal position for QF 6 is such a position as vertical beam size becomes minimum and horizontal beam size becomes maximum.

[Vertically Focusing Synchronized Quadrupole Electromagnet syQD 8, Horizontally Focusing Synchronized Quadrupole Electromagnet syQF 9, Electrostatic Deceleration P-Lens 10]

As understood from the formulas (1-1) and (1-2), the space-charge effect is weakened in inverse proportion to the 1.5 th power of the beam energy. Therefore, it is desirable that the beam energy be as high as possible in order to transport a high-current beam. On the other hand, in the beam scan type ion implantation system, in order to enter the beam at the same angle over the whole surface of the wafer, the beam center trajectory after the scanner should be parallelized by some methods. An electric field of the deceleration P-lens 10 has horizontal component acting on ions so that those ions on a trajectory located farther from the scan center trajectory make a larger inward turn. However, the longitudinal component of the electric field decelerates the ions simultaneously. Accordingly, the beam energy is reduced to a one-to-several ratio when passing through the deceleration P-lens 10. Further, since a strong electric field is applied over a region from the deceleration P-lens 10 to the first A/D column electrode 11, almost no electrons exist in this region. Therefore, the strong space-charge effect acts on the beam in this region.

Figure 8:
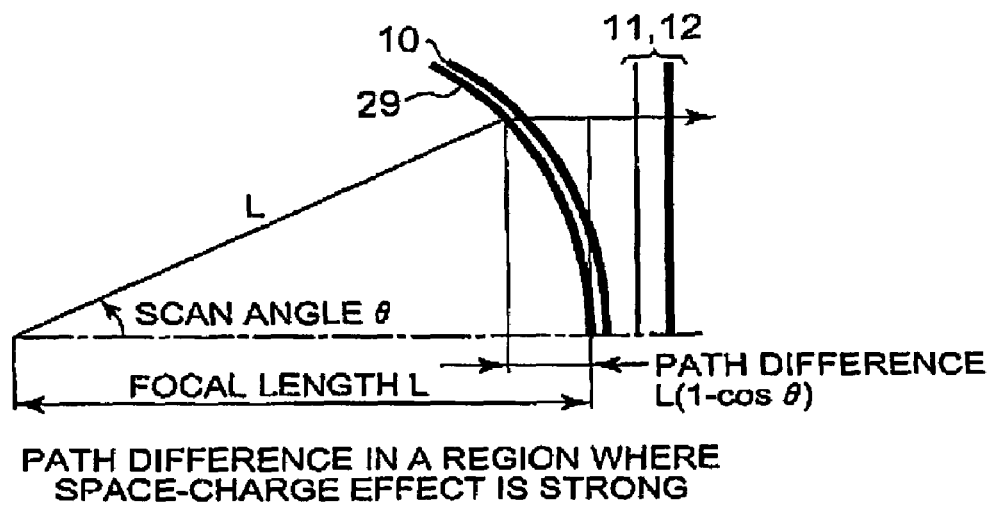
FIG. 8 is a diagram for explaining an operation of a deceleration P-lens used in the ion implantation system of FIGS. 5A and 5B.
Figure 9A:
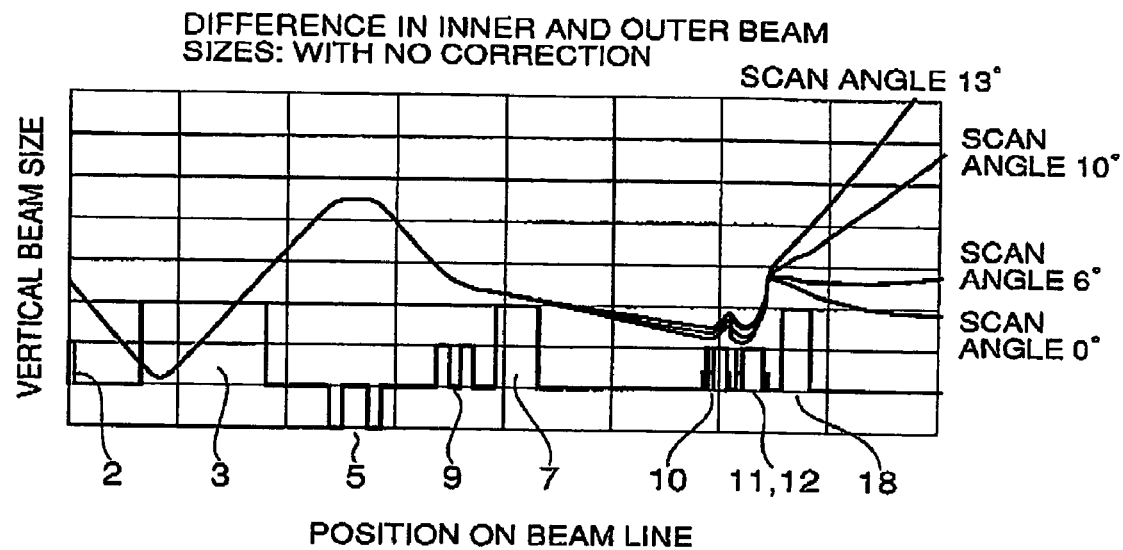
Figure 10A:
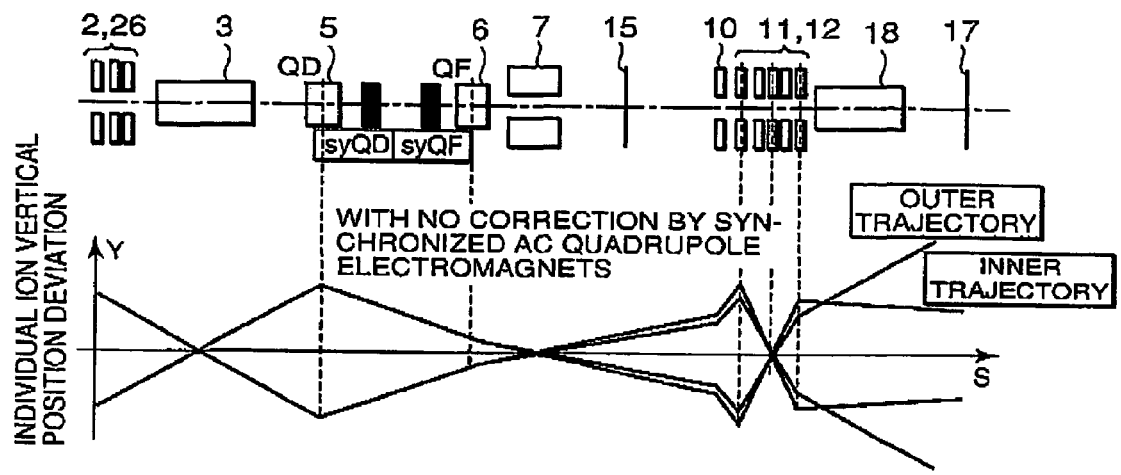

As shown in FIG. 8, let the deceleration P-lens 10 have a circular arc shape by zero-order approximation. In this case, with respect to the scan-center trajectory indicated by an alternate long and short dash line and a beam trajectory at a scan angle θ, a path difference of an electron lacking region becomes (focal length)×(1−cos θ). Accordingly, a beam divergence tendency becomes stronger in proportion to (1−cos θ) as the scan angle θ increases. If this difference remains in defocusing force between the center trajectory and the outer trajectory is left as it is, the beam hardly passes on the outer trajectory so that implantation uniformity in the horizontal direction is significantly degraded, as shown in FIGS. 9A and 10A Even if the difference in defocusing force caused by the foregoing path difference is small, this effect is amplified through deceleration at the first A/D column electrode 11 and the second A/D column electrode 12.

Figure 9B:
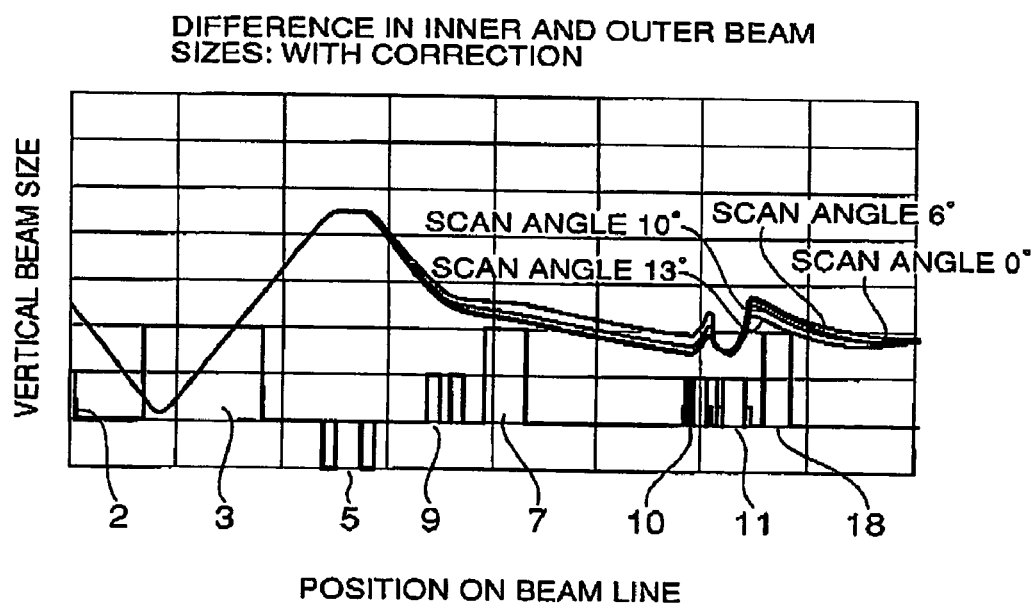
FIG. 9B is a diagram for explaining difference in beam sizes between inner and outer trajectories when correction is implemented by the synchronized quadrupole electromagnets in the ion implantation system of FIGS. 5A and 5B.
Figure 10B:
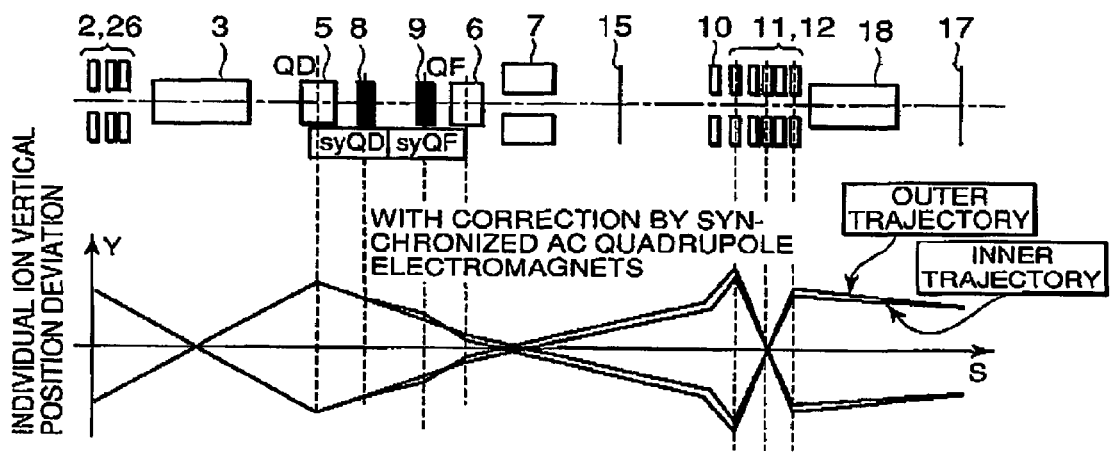
FIG. 10B is a diagram for explaining inner and outer beam trajectories when the correction is implemented by the synchronized quadrupole electromagnets in the ion Implantation system of FIGS. 5A and 5B.
Figure 11:
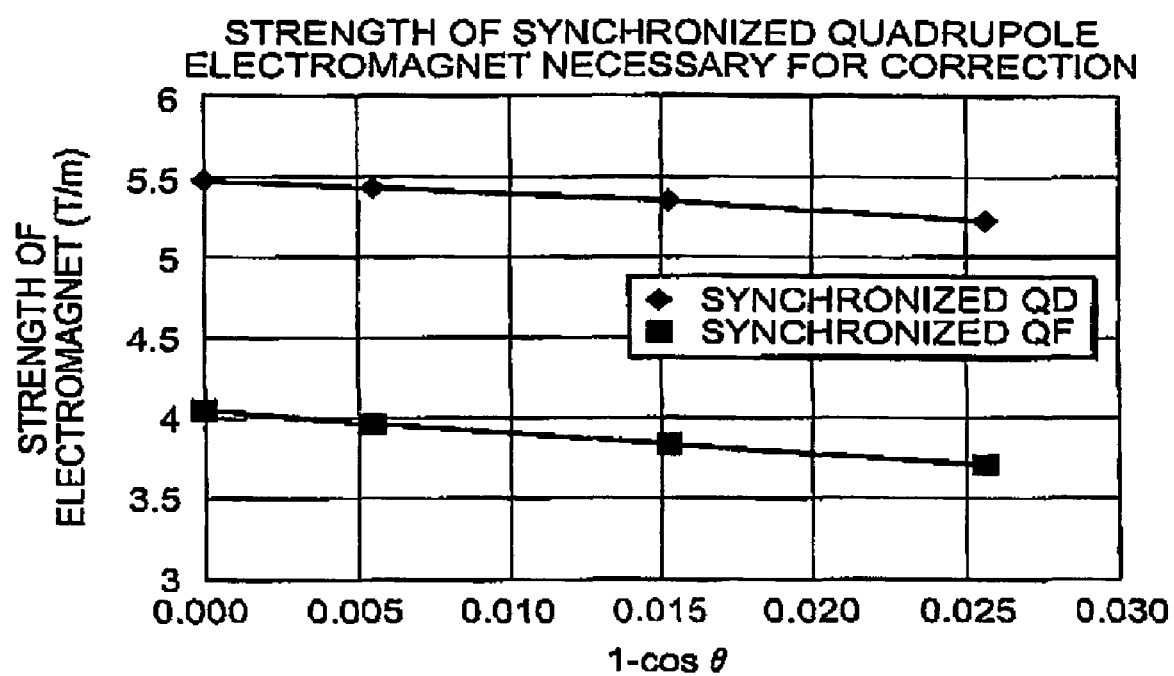
FIG. 11 is a characteristic diagram for explaining a strength of each of the synchronized quadrupole electromagnets necessary for the correction thereby in the ion implantation system of FIGS. 5A and 5B.

This problem can be solved by changing magnetic field gradients of the synchronized quadrupole electromagnets syQD 8 and syQF 9 depending on the scan angle θ. Specifically, in the example of FIGS. 9A and 10A, the magnetic field gradients of the pair of synchronized quadrupole electromagnets syQD 8 and syQF 9 are changed in proportion to (1−cos θ) with negative proportional constants as shown in FIG. 11. As a result, as shown in FIGS. 9B and 10B, the same amount of beam as that on the trajectory of the scan-center can be transported even on the outer trajectory since the beam sizes and the beam divergence angles can be substantially matched with each other. This is achieved by the synchronized quadrupole electromagnets syQD 8 and syQF 9.

In this embodiment, coil currents of the synchronized quadrupole electromagnets syQD 8 and syQF 9 are controlled synchronously with a deflection electrode voltage (scan voltage) of the scanner 7. A relationship between the scan angle θ and the scan voltage V is substantially given by the following formula (2).

$$V = Ca \cdot V_{ext} \cdot \tan \theta \quad (2)$$

In the formula (2), $V_{ext}$ is an extraction voltage (a potential difference between the ion source 1 and the terminal 37) and Ca is a proportional constant A coil current $I_Q$ of the synchronized quadrupole electromagnets is proportional to the magnetic field gradients thereof and, as shown in FIG. 11, each magnetic field gradient is proportional to (1−cos θ). Given that a proportional constant and an intercept thereof are Cb and Cc, the following formula (3) is obtained.

$$I_Q Cb \cdot (1-\cos \theta) + Cc \quad (3)$$

Since the scan angle θ is small, the following formula (4) is obtained by performing a Taylor's expansion of the formulas (2) and (3) with respect to the scan angle θ, taking the first order tern thereof, and substituting θ of the formula (2) into the formula (3).

$$I_Q = A \cdot V^2 + B \quad (4)$$

In the formula (4), constant portions are rearranged and newly given as coefficients A and B.

In this manner, it is appropriate that the coil current $I_Q$ of the synchronized quadrupole electromagnets be controlled to follow the deflection scan voltage V in the form of the quadratic expression given by the formula (4).

A waveform of the scan voltage V (or scan speed) is determined before ion implantation so that a beam current becomes uniform over the scanning range on the wafer. With respect to the coefficients A and B, proper values thereof are determined by comparing beam images obtained at the center trajectory and the outer trajectory by the use of the rear profile monitor 17.

By installing such a system, there occurs no difference in beam quantity and quality between the center trajectory and the outer trajectory for the scanning so that it becomes possible to carry out the wafer scanning with a low-energy high-current beam.

The deceleration ratio of the deceleration P-lens 10 is preferably about 4:1. Further, it is preferable that the curvature of the deceleration P-lens 10 be set small to reduce the difference in path length between the scan center trajectory and outer trajectory. A distance between a downstream side of the scanner 7 and the deceleration P-lens 10 is shortened to reduce space-charge effect at the high deceleration ratio.

Note that the beam transformer may be formed by a vertically focusing synchronized quadrupole electrode syEQD and a horizontally focusing synchronized quadrupole electrode syEQF, in place of the synchronized quadrupole electromagnet syQD 8 and the synchronized quadrupole electromagnet syQF 9. Since these electrodes are well known, explanation thereof is omitted.

[First A/D Column electrode 11, Second A/D Column electrode 12, First A/D Column High-Voltage Power Supply 35, Second A/D Column High-Voltage Power Supply 36]

The electrostatic deceleration P-lens 10 parallelizes the beam for scanning by its focusing action in the horizontal (scanning) direction and also has a fairly strong focusing force in the vertical direction. If the vertical focusing force remains as it is, it makes the beam after passing through the deceleration P-lens 10 rapidly diverge in the vertical direction due to overfocusing. This action is particularly large with respect to a low-energy beam.

In view of this, a pair of electrodes that have a strong focusing effect on the beam only in the vertical direction and do not act on the beam in the horizontal direction are installed close to the deceleration P-lens 0. These electrodes are the first A/D column electrode 11 and the second A/D column electrode 12. The divergence in the vertical direction generated by the deceleration P-lens 10 is canceled by the focusing lens effect in the vertical direction of the first and second A/D column electrodes 11 and 12 so that it is possible to control the beam size and the beam divergence angle in the vertical direction on the wafer. The lens effect increases as the energy decreases. Between the downstream electrode of the deceleration P-lens 10 and a ground electrode 12' installed on the downstream side of the A/D column electrode 12, longitudinal electric field is formed for deceleration in the low energy ion Implantation or for acceleration in the high energy ion implantation. Specifically, the outlet-side electrode 10' of the deceleration P-lens 10 has a negative potential during deceleration and a positive potential during acceleration with respect to the ground electrode 12'. Correspondingly thereto, in order to allow the A/D column electrodes 11 and 12 to have the focusing lens effect, it is arranged that positive and negative high voltages can be selectively and Independently applied to the A/D column electrodes 11 and 12, respectively. When the ion beam hits on the electrode while the positive high voltage is applied to the electrode, the voltage becomes unstable or the power supply fails because the first A/D column high-voltage power supply 35 cannot let a reverse current flow therein.

Figure 12:
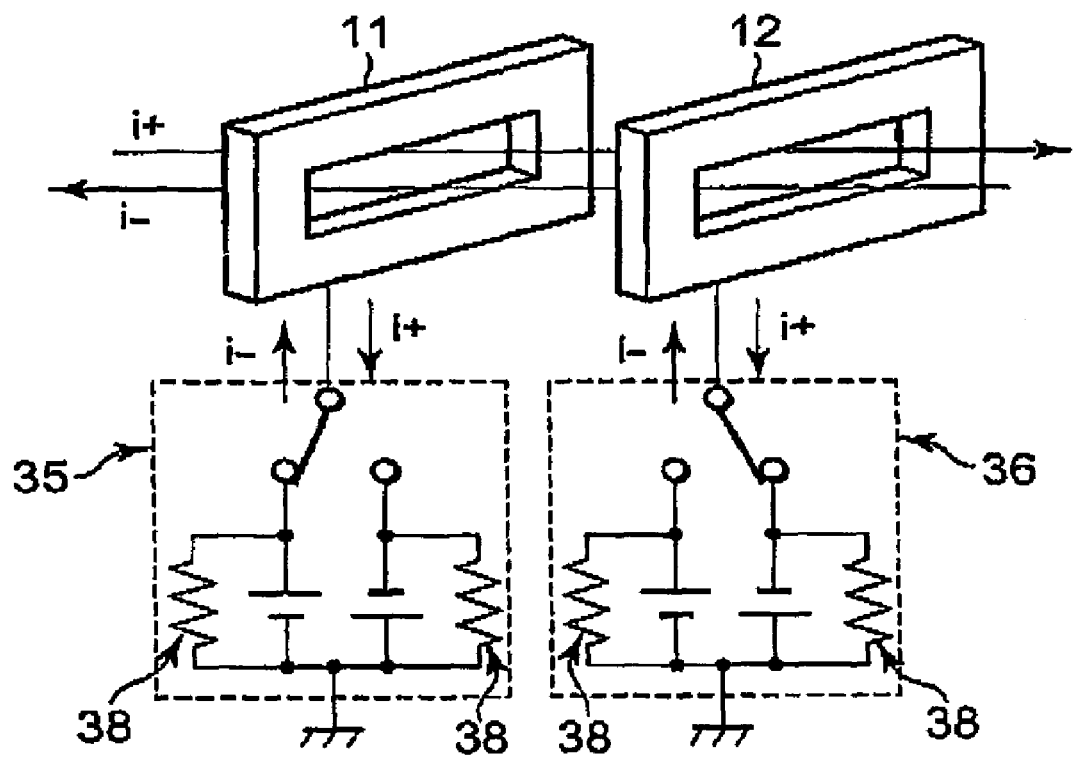
FIG. 12 is a diagram showing one example of an A/D (acceleration/deceleration) column high-voltage power supply circuit for each of A/D (acceleration/deceleration) column electrodes in the ion implantation system of FIGS. 5A and 5B.

Therefore, as shown in FIG. 12, each of the first AD column high-voltage power supply 35 and the second A/D column high-voltage power supply 36 has two positive and negative power supplies that are switchable therebetween. Each of the positive and negative power supplies has a feedback resistor 38 connected in parallel so as to allow a reverse current to flow. Further, since these electrodes are located near the AEF plasma showers 20, ions and electrons of plasma tend to flow therein. Therefore, the same measure is taken also with respect to the reverse current while the negative voltage is applied.

Figure 13:
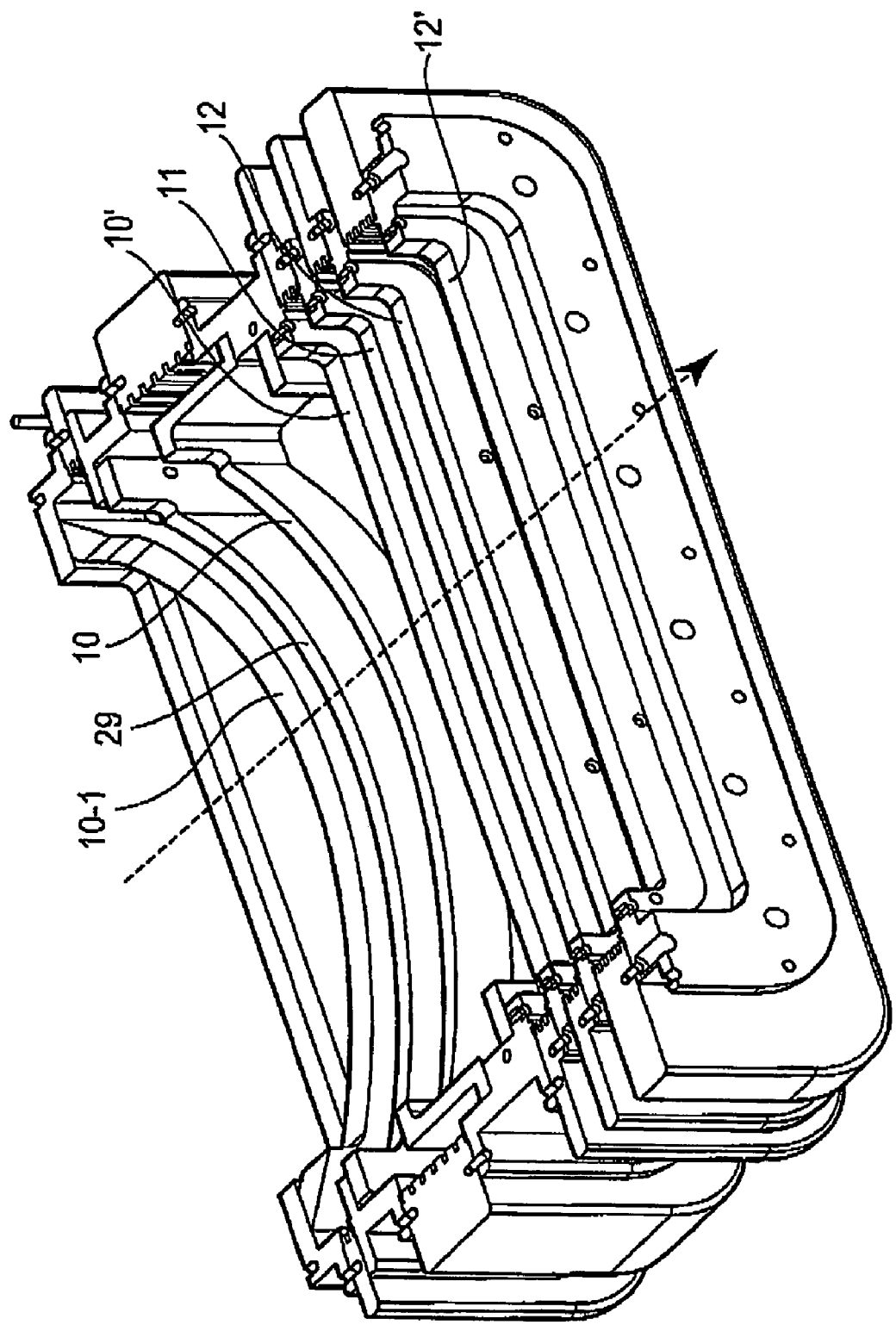
FIG. 13 is a perspective view showing one example of a disposing manner of a deceleration P-lens and the A/D column electrodes in the ion implantation system of FIGS. 5A and 5B.

FIG. 13 shows one example of a combination of the deceleration P-lens 10 including the electron suppression electrode 29, the P-lens outlet-side electrode 10', the first and second A/D column electrodes 11 and 12, and the ground electrode 12'. This figure shows the lower half of the structure and the A/D column. As mentioned before, the A/D column is composed of the electrodes 10', 11, 12, 12' and insulators therebetween.

Figure 14:
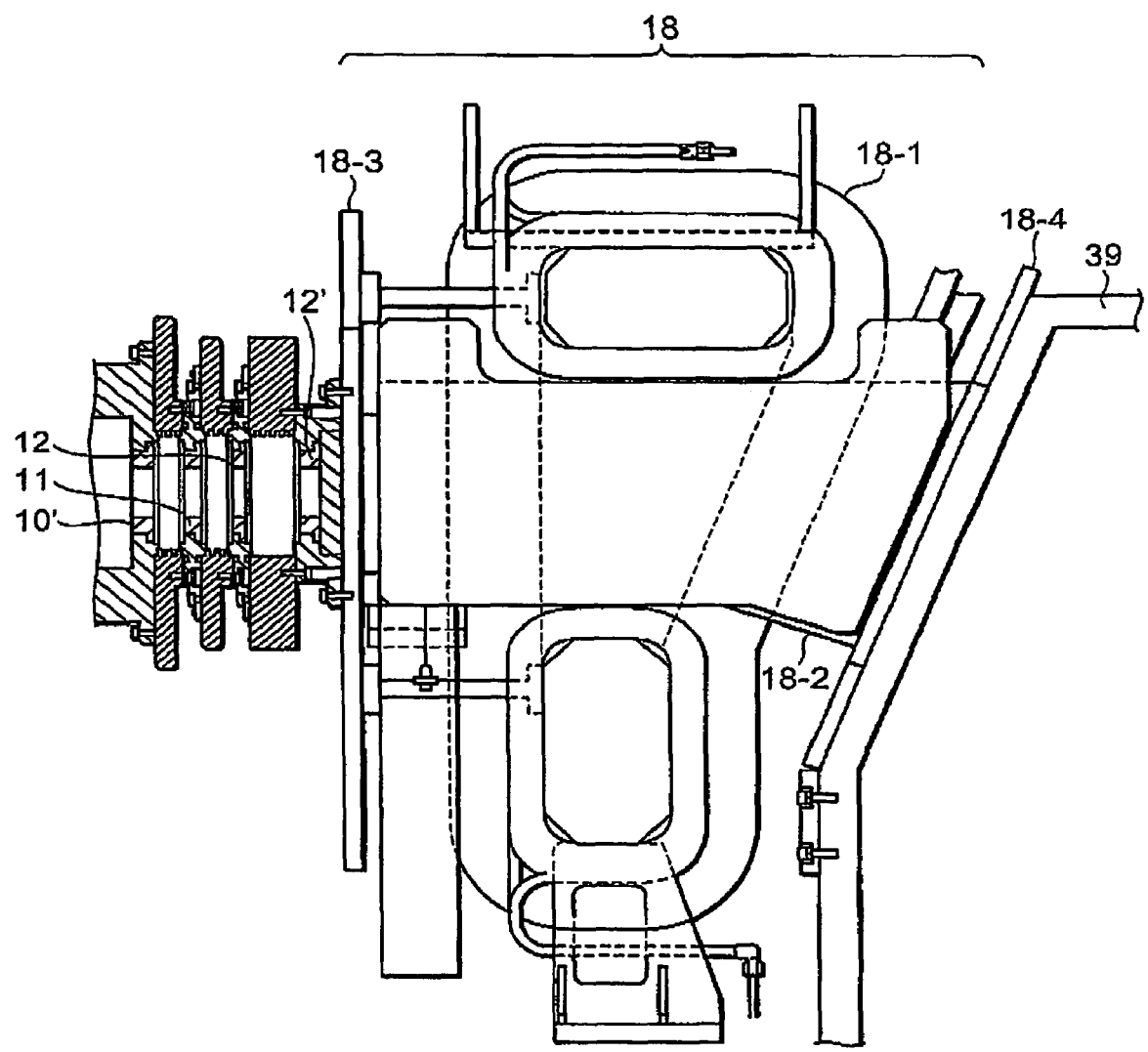
FIG. 14 is a sectional view showing one example of a disposing manner of the A/D column electrodes and an angular energy filter in the ion implantation system of FIGS. 5A and 5B.

FIG. 14 shows a combination of the P-lens outlet-side electrode 10', the first and second A/D column electrodes 11 and 12, the ground electrode 12', and the hybrid AEF 18. The AEF 18 is installed on the downstream side of the A/D column. The AEF 18 comprises a dipole electromagnet 18-1 and an AEF chamber 18-2 insertedly installed in a space substantially at the center of the AEF coils. The AEF 18 further comprises magnetic shields 18-3 and 18-4 installed on a beam incident side and a beam outgoing side, respectively. The AEF 18 is fixed between the A/D column side and the process chamber 39.

[Steering Electromagnet for Horizontal Direction Center Trajectory Correction STX 13, Steering Electromagnet for Vertical Direction Center Trajectory Correction STY 14, Front Profile Monitor 15, injection Faraday Cup 16, Rear Profile Monitor 17]

The devices such as the electrodes and the electromagnets in the beam line are not actually installed at positions as designed and therefore there always occur slight alignment errors. For example, while the mass analysis electromagnet device 3 slightly rotates about the beam axis as a rotation axis, a small horizontal component of magnetic field is generated and it slightly deflects the beam to the vertical direction. An error in parallel movement of the quadrupole electromagnet in the transverse plane (perpendicular to the beam axis), small tilts of the electrode relative to the beam axis, minute rotation of the electrode about the beam axis, and so on act to slightly bend the center trajectory of the beam to shift the beam from the primary designed trajectory. If these errors remain as they are, not only the ion implantation angle with respect to the crystal axis of the wafer goes wrong, but also the transportable beam current is largely reduced in the worst case. As a countermeasure to this problem, the following center trajectory correction system is installed.

This system comprises the precisely-aligned front and rear profile monitors 15 and 17 each capable of measuring the center position of the beam, the pair of steering electromagnets STX 13 and STY 14, the three-axis drive mechanism 2-1 (particularly the tilt axis) of the extraction electrode 2, a fine-adjustment function of the mass analysis electromagnet device 3 and the beam-centering hole 4-3 of the mass analysis slit 4.

FIGS. 15A and 15B show one example of the front profile monitor 15. The front profile monitor 15 comprises a frame 15-1 surrounding a space large enough to receive the beam therein, and a support portion 15-2 connecting between the frame 15-1 and a drive mechanism (not illustrated). In the space defined by the frame 15-1, two wires 15-3 and 15 4 are stretched so as to cross each other at right angles. When the beam hits on each wire, a current depending on an intensity of the beam flows in the wire. As shown in FIG. 15B, the front profile monitor 15 is obliquely inserted into and removed from a beam passing region. Horizontal and vertical distribution of beam ions are obtained by measuring the electric currents flowing the two wires 15-3 and 154. In this embodiment, the front profile monitor 15 is installed on the downstream side of the scanner 7 but may be installed on the upstream side thereof.

FIG. 16 shows one example of the rear profile monitor 17. The rear profile monitor 17 comprises two-rows of multi-cups 17-1 arranged in the vertical direction and a narrow Faraday cup (profile cup) 172 extending in the vertical direction. The multi-cups 17-1 are used for detecting a profile in the vertical direction and horizontal direction of the scanning beam whose cross-section is indicated by alternate long and short dash lines in the figure. The multi-cups 17-1 are arranged such that the multi-cups of the second row are located between the multi-cups of the first row, respectively, and therefore, it is possible to obtain seemingly continuous detection data. On the other hand, the narrow Faraday cup 17-2 is used for measuring the beam current and horizontal beam profile.

The rear profile monitor 17 is driven by a drive mechanism (not illustrated) so as to be horizontally movable in advancing with constant speed and retreating rapidly (moving direction is indicated by arrows in the figure). The horizontal and vertical beam profiles are obtained by measuring simultaneously the electric current flowing from each cups and the position of the cups. The beam current is obtained by integrating the current from the profile cups.

Note that the injection Faraday cup (front Faraday cup) 16 may be a well-known one. In this embodiment, the injection Faraday cup 16 is installed between the scanner 7 and the deceleration P-lens 10 as the beam parallelizing device but may be installed on the upstream side of the scanner 7. The injection Faraday cup 16 is used also in the case where the beam is intercepted midway. Further, the front profile monitor 15 and the injection Faraday cup 16 may be installed, as a set, between the scanner 7 and the deceleration P-lens 10 or on the upstream side of the scanner 7.

By the way, the center trajectory of the beam has two physical quantities to be corrected, one of which is a deviation in position relative to the designed center trajectory and another one of which is a deviation in angle relative to the designed center trajectory. Therefore, it is necessary to provide two correction devices with respect to each of the horizontal and vertical directions.

In this embodiment, with respect to the horizontal direction, the correction is performed by the fine adjustment of the mass analysis electromagnet device 3 and the horizontally steering electromagnet STX 13. On the other hand, with respect to the vertical direction, the correction is performed by the tilt axis of the extraction electrode 2 and the vertically steering electromagnet STY 14. Each steering electromagnet is a bending electromagnet with a small output.

Now, it is assumed that a beam center deviation of $x_1$ in the horizontal direction is detected by the front beam profile monitor 15 and a beam center deviation of $x_2$ in the horizontal direction is detected by the rear profile monitor 17. It is further assumed that, in order to eliminate such deviations, the bending angle is changed by $\Delta\theta_1$ by the fine adjustment of the mass analysis electromagnet device 3 and the kick angle of the horizontally steering electromagnet STX 13 is set to $\Delta\theta_2$. In this case, the following simultaneous equations are established.

$$b_{11}\Delta\theta_1 + b_{21}\Delta\theta_2 = -x_1$$

$$b_{12}\Delta\theta_1 + b_{22}\Delta\theta_2 = -x_2 \qquad (5)$$

where $b_{11}$, $b_{21}$, $b_{12}$, and $b_{22}$ are first-row-second-column components of transportation matrices from the mass analysis electromagnet device 3 to the front profile monitor 15, from the horizontally steering electromagnet STX 13 to the front profile monitor 15, from the mass analysis electromagnet device 3 to the rear profile monitor 17, and from the horizontally steering electromagnet STX 13 to the rear profile monitor 17, respectively. These coefficients are theoretically derived by a beam optics calculation. By solving the equations (5), necessary deflection angles $\Delta\theta_1$, $\Delta\theta_2$ are derived by the following formulas (6-1) and (6-2), respectively.

$$\Delta\theta_1 = (b_{21}x_2 - b_{22}x_1)/(b_{11}b_{22} - b_{12}b_{21}) \quad (6\text{-}1)$$

$$\Delta\theta_2 = (b_{12}x_1 - b_{11}x_2)/(b_{11}b_{22} - b_{12}b_{21}) \quad (6\text{-}1)$$

This also applies to the vertical direction.

By centering the beam lost on images from the two profile monitors, the error in implantation angle is also corrected automatically.

Figure 17:
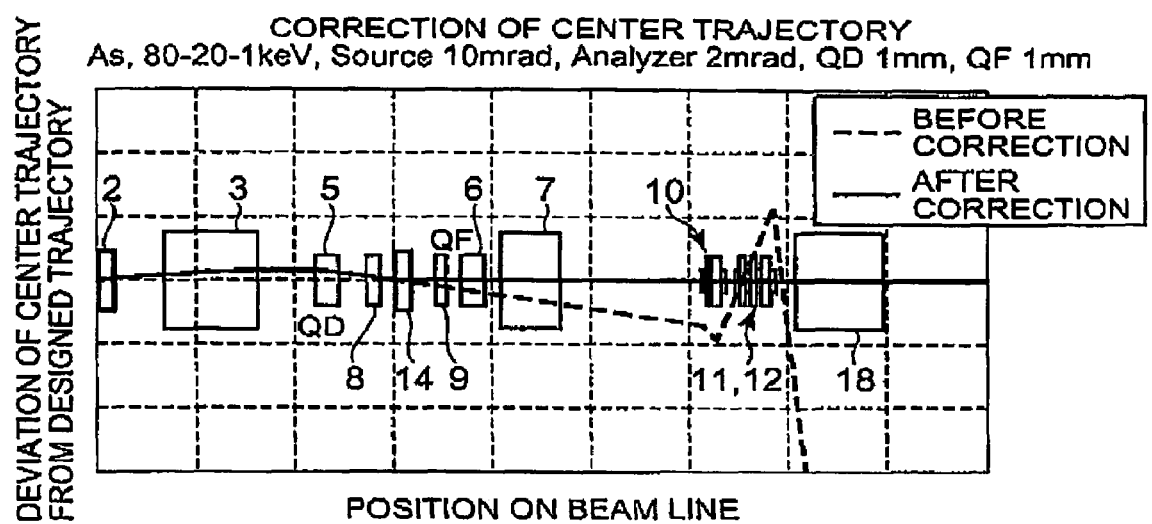
FIG. 17 is a diagram for explaining beam center trajectories obtained when correction by steering magnets is not performed and when it is performed, in the ion implantation system of FIGS. 5A and 5B.

FIG. 17 shows beam center trajectories obtained when there is a misalignment and when the correction is performed by the foregoing method. As an adjustment element in the horizontal direction, an offset voltage may be applied to the scanner 7 in place of the fine adjustment of the deflection angle by the mass analysis electromagnet device 3.

The foregoing step may be carried out by an automatic control. In order to practice it, it is at least required that the beam can be transported to the rear profile monitor 17 located near the wafer. If not so configured, an alignment adjustment should be performed with respect to each of the mass analysis electromagnet device 3 and the four quadrupole electromagnets QD 5, QF 6, syQD 8, and syQF 9 by the use of the beam centering hole 4-3 of the three-stage selectable mass analysis slit 4 and the front profile monitor 15. If properly aligned, the beam position on the front profile monitor 15 does not move even when coil currents of the foregoing four quadrupole electromagnets are varied.

Figure 18:
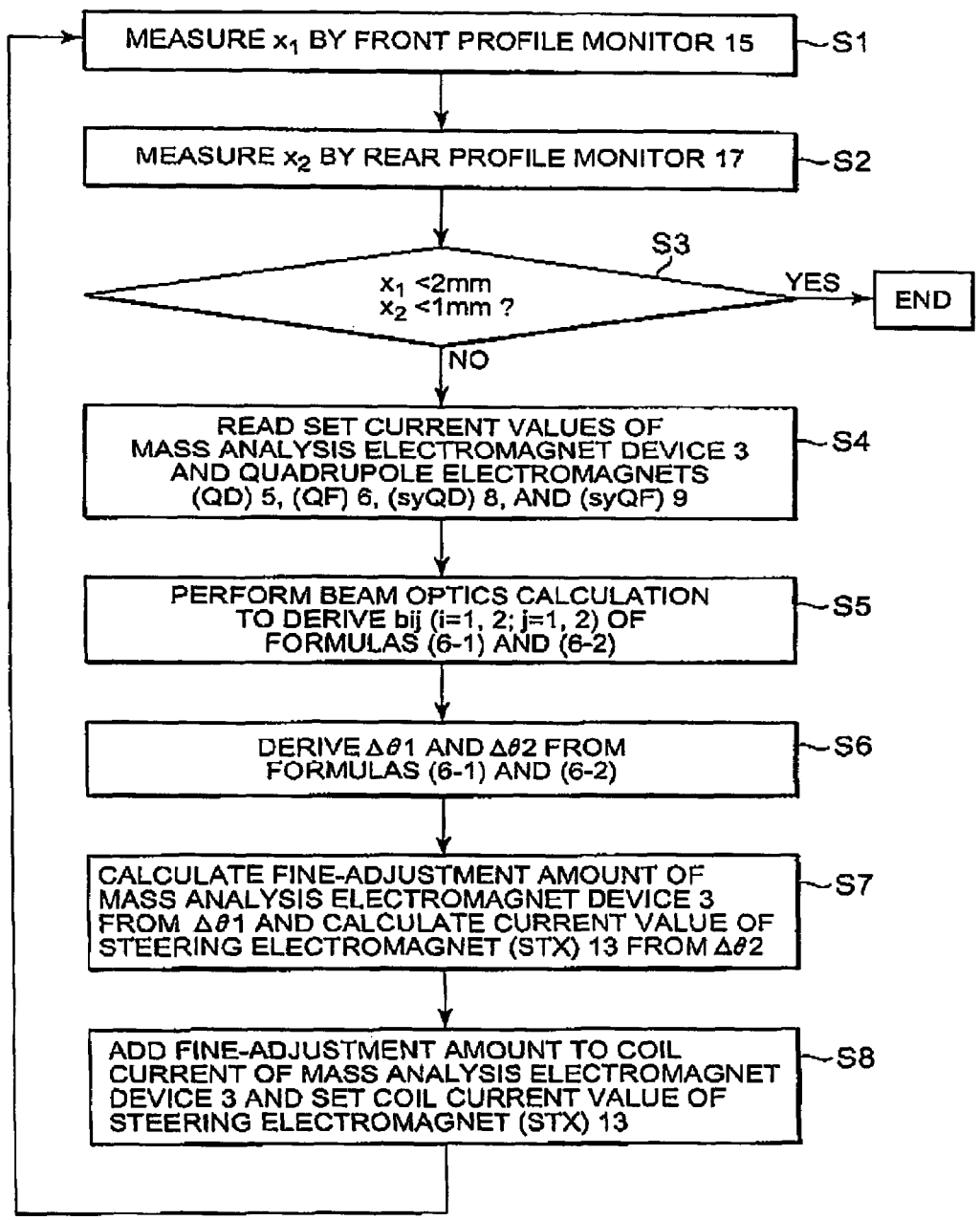
FIG. 18 is a flowchart showing an automatic center trajectory correction algorithm according to this invention.

FIG. 18 is a flowchart showing one example of an automatic center trajectory correction algorithm for performing the foregoing step by an automatic control. Brief description will be given hereinbelow, in step S1, a beam center deviation $x_1$ in the horizontal direction is measured by the front profile monitor 15. In step S2, a beam center deviation $x_2$ in the horizontal direction is measured by the rear profile monitor 17. In step S3, it is checked whether or not the measured beam center deviations $x_1$ and $x_2$ are smaller than set values, respectively. Here, as the set values, 2 mm and 1 mm are set with respect to the beam center deviations $x_1$ and $x_2$, respectively. This is, of course, only one example. If step S3 judges that both the measured beam center deviations $x_1$ and $x_2$ are smaller than the set values, respectively, the operation is finished. On the other hand, when at least one of the measured beam center deviations $x_1$ and $x_2$ is equal to or greater than the set value, the operation proceeds to step S4.

Step S4 reads set current values of the mass analysis electromagnet device 3 and the quadrupole electromagnets QD 5 and QF 6, and synchronized quadrupole magnets syQD 8 and syQF 9 at the scan angle of 0 degree. Subsequently, step S5 performs the foregoing beam optics calculation to derive coefficients $b_{ij}$ (i=1, 2; j=1, 2) of the formulas (6-1) and (6-2). In step S6, using the derived coefficients $b_{ij}$, deflection angle adjustment amounts $\Delta\theta_1$ and $\Delta\theta_2$ are derived from the formulas (6-1) and (6-2). In step S7, a fine-adjustment amount of the coil current of the mass analysis electromagnet device 3 is calculated from the bending angle adjustment amount $\Delta\theta_1$ and a current value of the horizontally steering electromagnet STX 13 is calculated from the kick angle $\Delta\theta_2$. In step S8, the fine-adjustment amount is added to the coil current of the mass analysis electromagnet device 3 and the foregoing calculated current value is given as a set current value of the horizontally steering electromagnet STX 13. The foregoing steps S1 to S8 are repeated until the condition of step S3 is satisfied.

The injection Faraday cup 16 has a function of stopping the beam while the front profile monitor 15 is used. Since the front profile monitor 15 is across the beam using two tungsten wires, it is necessary to stop the beam so as to prevent sputtered tungsten atoms from going downstream. Further, the injection Faraday cup 16 also has a function of preventing a high-current beam from reaching the process chamber 39 to contaminate portions around the wafer during tuning of the ion source and the mass analysis system.

FIG. 19 shows one example of a combination of the four quadrupole electromagnets QD 5, QF 6, syQD 8, and syQF 9 and the steering electromagnets STX 13 and STY 14. Note that the steering electromagnet STX 13 is, as shown in FIGS. 5A and 5B, installed between the mass analysis electromagnet device 3 and the mass analysis slit 4 but is not limited to such a location. It is better that the steering electromagnet STX 13 be installed at a position where the beam horizontally focuses or nearly focuses between the mass analysis electromagnet device 3 and the scanner 7. On the other hand, the vertically steering electromagnet STY 14 is installed between the mass analysis slit 4 and the scanner 7, particularly between the quadrupole electromagnets syQD 8 and syQF 9, but is not limited to the location between the quadrupole electromagnets syQD 8 and syQF 9. Specifically, the vertically steering electromagnet STY 14 may be installed anywhere on the upstream side of the front profile monitor 15.

[Hybrid AEF 18, Triple-Surface Energy Slit Unit 19]

Figure 20A:
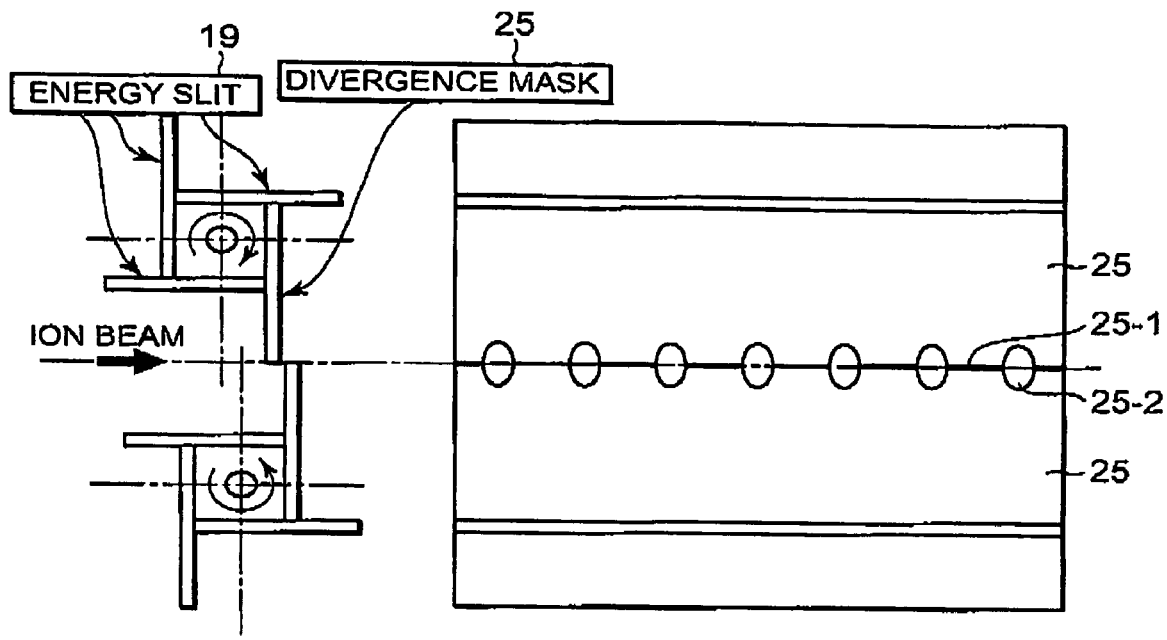
FIGS. 20A and 20B are diagrams for explaining an energy slit and a divergence mask used in combination therewith in the ion implantation system of FIG. 5.
Figure 20B:
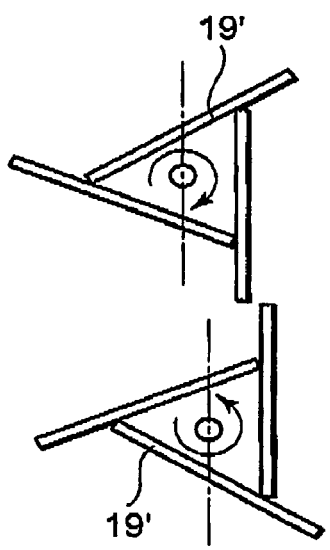

The angular energy filter and the energy slit are used also in the single-wafer middle-current ion implantation system. However, the AEF 18 is of a hybrid type where an electric field can assist a magnetic field only at a higher energy for preventing divergence of the low-energy high-current beam. Furthermore, as shown in FIG. 20B, in order to prevent cross-contamination due to sputtering by the high-current beam, the pair of energy slit units 19 is a by-rotation three-surface automatic switching type so that different ion species of B (or $BF_2$), P, and As do never hit on the same surface. Actually, since the later-described divergence mask 25 uses another surface, each of the pair of the energy slit units 19 is of a by-rotation four-surface automatic switching type.

The function of the AEF 18 and the energy slit unit 19 is that, like a conventional one, deflects a beam in the plane (vertical plane) perpendicular to a beam scan plane (horizontal plane) and passes only such an ion having predetermined energy, charge state, and mass toward the wafer. Dopant particles that are neutralized and cannot be measured as a beam current (cause of dose error), metal atoms sputtered in upstream beam-line, and particles generated at the upstream elements go straight on and hit on the striker plate 38-1 composed of a graphite plate. Further, such an ion that differs in charge, mass, or energy hits on a wall of the energy slit units 19 because a deflection angle thereof is different. In this manner, the function of increasing purity of the beam by filtering, which is possessed by the conventional middle-current ion implantation system, should be maintained also with respect to the low-energy high-current beam. This is guaranteed by having an energy resolution which is equal to or higher than that of the middle-current ion implantation system.

In the case of low energy, a reduction in beam current is suppressed by using the magnetic field AEF. However, the energy resolution is lowered with the deflection by the magnetic field as compared with the deflection by the electric field. An energy resolution E/ΔE at a position distanced from a deflection electrode and a deflection electromagnet by L, respectively, is given by the following formulas (7) and (8).

$$\frac{E}{\Delta E} = \frac{\frac{2}{3}\rho[1-\cos(\sqrt{3}\,\theta)] + \frac{2\sqrt{3}}{3}L\sin(\sqrt{3}\,\theta)}{2h} \quad (7)$$

$$\frac{E}{\Delta E} = \frac{\rho[1-\cos\theta] + L\sin\theta}{2h} \quad (8)$$

where p is a radius of curvature, h is a vertical width of the energy slit, and θ is a bending angle by the AEF 18. When the bending angle θ is small, it is understood, by performing a Taylor's expansion, that the energy resolution becomes about twice in the case of the electric field (for electric field: E/dE~Lθ/h, for magnetic field: E/dE~Lθ/2h).

In order to solve this problem, the bending angle θ of the AEF 18 is set greater than that in the conventional middle-current ion implantation system (when the bending angle θ is small, the energy resolution is proportional to the bending angle θ). With this arrangement, the energy resolution becomes higher than conventional one even in the use of the magnetic field AEF. Since the electric field AEF can be provided with a corresponding margin in energy resolution, a vertical slit width h is broadened to thereby increase a beam current where the energy is high.

The width of the energy slit unit 19 is variable wherein the width is set narrow only for $BF_2^+$ ions that dissociate in the beam line while the width is set broad for other ions. By this setting, it can be prevented that $BF^+$ ions produced by the dissociation are implanted into the wafer at false angles in the surfaces of the slit and the striker plate where a part of the beam always hits, previously implanted ions accumulate. When the ion species is switched, if the beam hits on the same portion, the previous ion species is forced out by sputtering and then deposits on the surface of the wafer. This is the generation process of the cross-contamination. This can be prevented by causing the respective ion species to hit on different surfaces. This is particularly effective for a high-current beam with relatively high energy where the sputtering rate becomes high.

The pair of energy slit units 19 and the rear profile monitor 17 provided backward of the AEF 18 constitute a measurement system for a beam implantation angle in the vertical direction. By making the beam, pass through the pair of narrowed energy slit units 19, it is confirmed whether an image exists at the center in the vertical direction on the rear profile monitor 17 or not. If there is a deviation, the beam implantation angle in the vertical direction is corrected through an adjustment of the AEF 18 or the tilt angle of the wafer.

[AEF Plasma Showers 20, Permanent Magnets 21 for Confinement Magnetic Field Formation]

This is a system wherein, by using the magnetic field in the horizontal direction (Beam scanning direction) of the magnetic field AEF to supply electrons extracted from the AEF plasma showers 20 to the beam (normal mode), the ion charge of the low-energy beam after deceleration is compensated. Alternatively, it may be a system wherein, by using the extracted electrons as primary electrons, electrodes of the electric field AEF as walls of a plasma arc chamber, and the magnetic field of the magnetic field AEF as a plasma confining magnetic field and by generating plasma in a region where the beam passes to supply a large amount of electrons to the beam (plasma box mode), the ion charge of the low-energy beam after deceleration is compensated.

By installing this charge compensation system and adjusting the focusing force of the foregoing four quadrupole electromagnets and A/D column electrodes 11 and 12, it is possible to transport the low-energy high-current beam to the wafer.

[Plasma Shower 22, Wafer 23]

The plasma shower 22 serves to prevent charging of the wafer 23 and, simultaneously, serves to supply electrons to the beam between the AEF 18 and the wafer 23 to compensate charge of ions, thereby reducing the space-charge effect.

[Triple-Surface Beam Dump 24]

Figure 21:
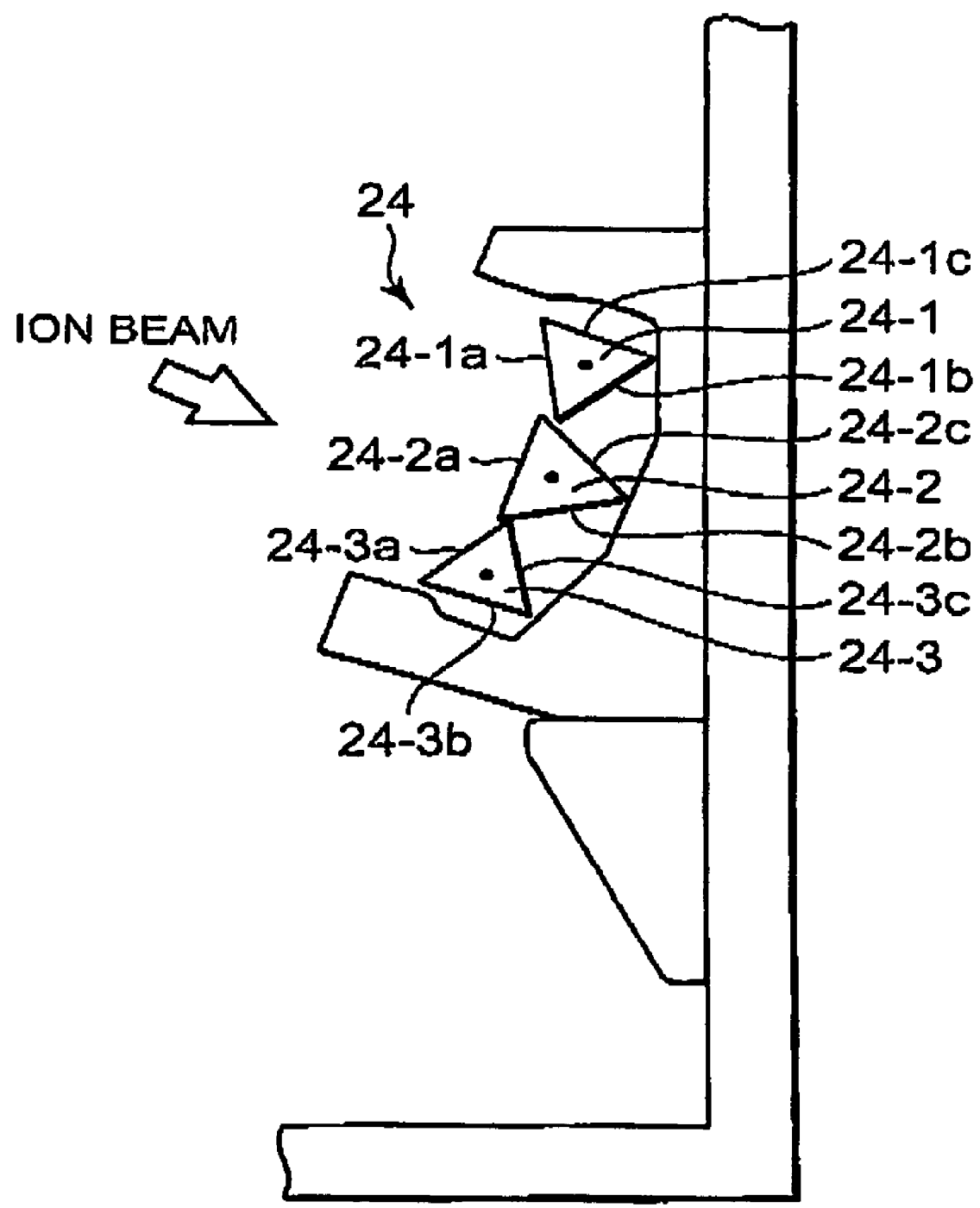
FIG. 21 is a diagram showing one example of a triple-surface beam dump in the ion implantation system of FIGS. 5A and 5B.

The beam dump 24 is a place where the largest amount of the beam hits as compared with the other portions near the wafer and, therefore, is a place where the risk as a contamination source is the highest in view of this, as shown in FIG. 21, the beam dump 24 is formed by three rotation-type triple surface structure bodies 24-1, 24-2, and 24-3. A surface of each triple-surface structure body where the beam hits is automatically switched for each field of ions of B (or $BF_2$), P, and As, to thereby prevent cross-contamination. For example, when B (or $BF_2$) ions are implanted, surfaces 24-1a, 24-2a, and 24-3a of the triple-surface structure bodies 24-1, 24-2, and 24-3 are oriented against the beam incident direction. On the other hand, when P ions are implanted, surfaces 24-1b, 24-2c, and 24-3b of the triple-surface structure bodies 24-1, 24-2, and 24-3 are oriented against the beam incident direction. In the state shown in FIG. 21, the adjacent vertexes of the triple-surface structure bodies overlap each other so as to prevent the beam from leaking to the bottom portion of the beam dump. By installing this system, it is possible to suppress cross-contamination to a low level even in the high-current implantation process.

Further, the beam dump 24 has a beam current measurement function on the basis of the same principle as that of the Faraday cup and measured values are referred to in a final beam current adjustment. Moreover, it is configured such that the pair of the triple-surface energy silt units 19 shown in FIG. 20 and the triple-surface structure bodies 24-1 to 24-3 in the beam dump 24 are simultaneously switched automatically depending on the ion species that is implanted into the wafer.

[Divergence Mask 25]

The divergence mask 25 and the rear profile monitor 17 constitute a measurement system for a parallelism of a scan trajectory in the horizontal direction and a beam divergence angle. As shown in FIG. 20A, the divergence mask 25, along with the triple-surface energy slit unit 19, uses four surfaces of each of two quadratic prisms with vanes. Each vane of the divergence mask 25 has concave and convex portions at a forward end thereof. When the forward ends of the two vanes approach closest to each other by rotation, convex portions 25-1 of the divergence mask 25 match each other to thereby Intercept the beam while concave portions 25-2 of the divergence mask 25 allow the beam to pass therethrough.

Observing the downstream side from the upstream side in this state, it is like about ten (seven in FIG. 20) holes are formed in one plate.

When images of the horizontally moving beam passing through these holes are measured by the rear profile monitor 17 located backward, as many peaks as the number of the holes appear. If intervals of the peaks and intervals of the centers of the holes are all equal to each other, the beam is parallel over the whole region of the wafer. Further, given that the width of a base portion of each peak (90% of the peak) is 2 W, the diameter of each hole is 2 r, and the distance between the divergence mask 25 and the rear profile monitor 19 is $D_1$, $(W-r)/D_1$ is a beam divergence angle (a focusing angle in the case of a negative value) at that scan position. If this value is the same with respect to all the peaks, the beam divergence angles are constant over the whole surface of the wafer.

When the parallelism is low, the applied voltage of the deceleration P-lens 10 is adjusted. When the beam divergence angle is too large or when the beam divergence angles are not constant, coil currents of the DC quadrupole electromagnets QD 5 and QF 6, the synchronized quadrupole electromagnets syQD 8 and syQF 9, and the voltages of A/D column electrodes 11 and 12 are finely adjusted. When a feedback control is executed, the rear profile monitor 17, after measuring the parallelism of the beam, feeds back the measurement result to the beam parallelizing device so that the beam parallelism meets a predetermined value.

By installing this system, the implantation angle accuracy in the horizontal direction can be guaranteed.

[Electron Suppression Electrodes 26 to 31]

The electron suppression electrodes are installed before and after a positive-voltage electrode that absorbs electrons and before the lower voltage side of a pair of electrodes that can produce an electric field in a direction of accelerating electrons along the beam line, and a negative voltage higher than a potential of a bare ion-beam is applied thereto. With this arrangement, electrons are repelled and thus prevented from flowing out of the beam line. Even without the active electron supply system of electrons such as the plasma shower, electrons are produced to some degree when ions hit on edge portions of an aperture or collide with residual gas. By holding them in the beam line and using them to compensate the beam charge, the transportable beam current increases.

[ion Source High-Voltage Power Supply 32, Terminal High-Voltage Power Supply 33, Deceleration P-lens High-Voltage Power Supply 34]

Generally, the ion source and its power supply are installed in the terminal 37 (on terminal potential) and implantation energy becomes the sum of an ion source voltage and a terminal voltage. In this case, in order to enhance energy accuracy, it is necessary to enhance accuracy of the terminal high-voltage power supply 33 and all the high-voltage power supplies in the terminal 37. Discharge generating in the terminal 37 and between the terminal 37 and ground changes the implantation energy directly. Therefore, by installing the ion source 1 outside the terminal 37 and applying a high voltage from the earth potential, the implantation energy can be determined only by the potential of the ion source 1. In this case, by enhancing the accuracy only of the ion source high-voltage power supply 32, the implantation energy accuracy is ensured. However, it is difficult to guarantee the power supply accuracy when a dynamic range exceeds two figures. Accordingly, by dividing the ion source voltage into one for high energy and the other for low energy, using accurate power supply devices for both, and automatically switching therebetween, the accuracy is guaranteed over all the energy region of 0.2 keV to 80 keV.

On the other hand, the deceleration P-lens high-voltage power supply 34 is a power supply that determines the beam parallelism, and the beam parallelism is determined by the beam energy before entering the P-lens 10. Particularly, the beam energy before the P-lens 10 is almost determined by the terminal voltage at low energy and, therefore, the deceleration P-lens high-voltage power supply 34 can better achieve the accuracy of parallelism when it is installed on the terminal potential.

Figure 22:
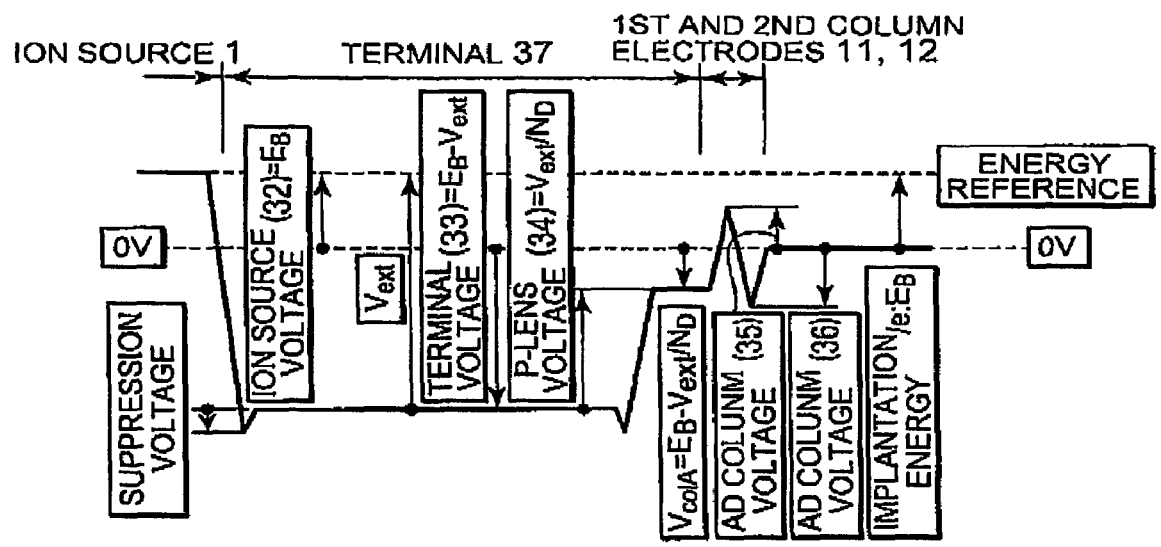
FIG. 22 is a diagram for explaining a voltage applied to each portion in the ion implantation system of FIGS. 5A and 5B and a beam energy corresponding thereto.

FIG. 22 shows a relationship between a voltage of each portion and a beam energy. By using this power supply connection manner, it is possible to ensure the energy accuracy of the lower-energy high-current beam.

This invention has been described in terms of the preferred embodiment, but this invention is not limited to the foregoing embodiment and various changes can be made.

Figure 23:
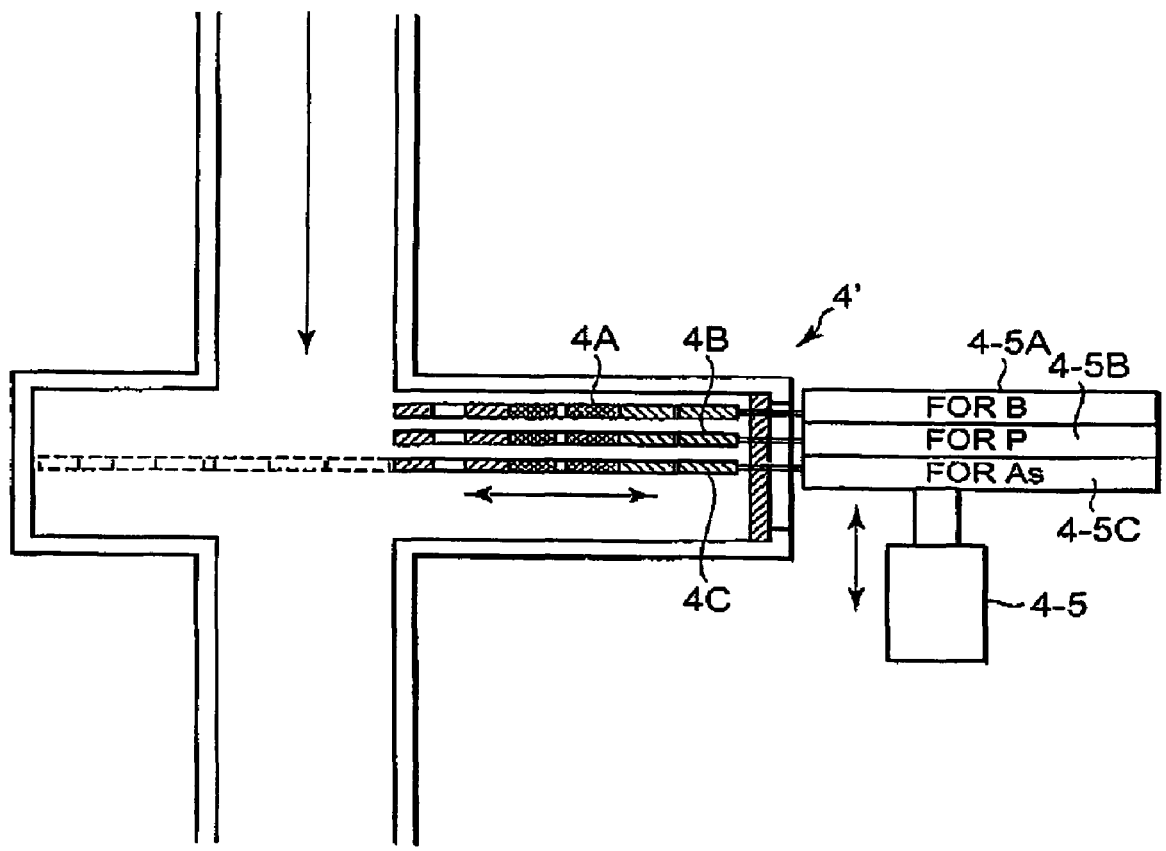
FIG. 23 is a diagram showing a modification of the mass analysis slit shown in FIG. 7.

FIG. 23 shows a modification of the three-stage selectable mass analysis slit 4 explained with reference to FIG. 7. A mass analysis slit 4 shown in FIG. 23 is of a triple three-set selectable type and comprises three mass analysis slits 4A, 4B, and 4C each corresponding to the mass analysis slit 4 shown in FIG. 7. The mass analysis silts 4A, 4B, and 4C are used for ion species of B (or $BF_2$), P, and As, respectively, i.e. each of the slits 4A, 4B, and 4C has one to one correspondence to the ion species. The mass analysis slits 4A, 4B, and 4C are driven by advance/retreat (horizontal movement) drive mechanisms 4-5A, 4-5B, and 4-5C, respectively, so as to advance or retreat with respect to a mass analysis position. For example, in FIG. 23, the mass analysis slit 4C is driven by the horizontal drive mechanism 4-5C to advance to a position indicated by dotted lines, i.e. the mass analysis position. For an adjustment in a longitudinal direction, a longitudinal drive mechanism 4-5 is provided. After the adjustment in the longitudinal direction by the longitudinal drive mechanism 4-5, the mass analysis slits 4A, 4B, and 4C are fixed.

By transporting a beam using the beam line as described above, it is possible to realize a single-wafer high-current ion implantation system that is high in productivity even at low energy and that achieves a high implantation angle accuracy, a high dose accuracy, and a high beam purity.

According to this invention, it is possible to reduce the amount of metal (metal contamination) that is implanted along with dopants, the amount of dopants of different kinds (cross-contamination), and the amount of ions of different energy (energy contamination ) as compared with the batch system. Further, it is possible to reduce the number of dust particles that adhere to or collide with the front and back sides of a wafer as compared with the batch system. Accordingly, it is possible to provide an irradiation system with ion beam suitable for a single-wafer high-current ion implantation system for manufacturing an advanced semiconductor device.

The irradiation system with the ion beam according to this invention can be used for manufacturing semiconductor devices, improving the surfaces of general materials, manufacturing TFT liquid crystal display devices, and so on.

What is claimed is:

1. An irradiation system with ion beam which is configured so that a beam from a beam generation source is caused to pass through a mass analysis device and a beam transformer, then pass through a deflector for scanning which swings the beam reciprocally, a beam parallelizing device, an acceleration/deceleration device, and an energy filtering device, and then is incident on an irradiation target, a hybrid angular energy filter generating both electric and magnetic field to bend the beam swung with the deflector in a plane perpendicular to a beam scan plane provided as said energy filtering device, and a pair of multi-surface energy slit units each having a plurality of energy slits that are switchable therebetween depending on an ion species for irradiation are provided on a downstream side of said hybrid angular energy filter, wherein said irradiation target is irradiated with pure-energy high-current beams from low energy to high energy in a state where contamination such as neutral particles, different kinds of dopants, metal, and dust particles are in extremely small amounts.

2. An irradiation system with ion beam according to claim 1, wherein said energy filtering device deflects the beam in a plane perpendicular to a scan plane, and each of the plurality of energy slits is selected corresponding to the ion species for irradiation so that the beam may not hit on a contaminated surface by the other ion species and only such an ion having a required energy may passes with a correct angle.

3. An irradiation system with ion beam according to claim 2, wherein said multi-surface energy slit unit has a three-surface rotatably switching type structure in which the energy slits of three surfaces having one to one correspondence to three kinds of ion species are integrated.

4. An irradiation system with ion beam according to claim 2, wherein said multi-surface energy slit unit has a four-surface rotatably switching type structure in which the energy slits of three surfaces having one to one correspondence to three kinds of ion species and a divergence mask to measure the incident angle and the divergence angle of the parallelized beam are integrated.

5. An irradiation system with ion beam according to claim 2, wherein a rotation-type or linear-type divergence mask is provided at the downstream side of said energy filtering device.

6. An irradiation system with ion beam according to any one of claims 1 to 5, further comprising a multi-surface beam dump provided on the downstream side of said irradiation target, said multi-surface beam dump serving to receive a portion of a beam that was not incident on said irradiation target and having a beam current measurement function.

7. An irradiation system with ion beam according to claim 6, wherein said multi-surface beam dump comprises at least one plural-surface structure body having a plurality of surfaces corresponding to the ion species for irradiation, and is configured such that the surfaces of said plural-surface structure body corresponding to the ion species for irradiation are switchable by rotation so as to receive the beam without exposing a contaminated surfaces by other ion species.

8. An irradiation system with ion beam system according to claim 7, wherein end portions of the adjacent plural-surface structure bodies of said multi-surface beam dump overlap each other, when receiving the beam, so as to prevent the beam from passing therethrough rearward and hitting on the metal wall.

9. An irradiation system with ion beam according to claim 7, wherein said multi-surface energy slit unit and said multi-surface beam dump are simultaneously changed depending on the ion species to be used for irradiation.

10. An automatic tuning system applied to the irradiation system with ion beam according to claim 1 or 2 and configured such that, in automatic tuning of an energy filtering device and said multi-surface energy slit unit, one of the surfaces of said multi-surface energy slit unit is selected and the slit width is set, and then said filtering device is finely adjusted.

11. An irradiation system with ion beam which is configured that a beam from a beam generation source is caused to pass through a mass analysis device and a beam transformer, then pass through a deflector for scanning which swings the beam reciprocally, a beam parallelizing device, an acceleration/deceleration device, and an energy filtering device, and then is incident on an irradiation target, wherein a few sets of mass analysis slits are provided on the downstream side of said mass analysis device, and the number of the sets of said mass analysis slits corresponding to the number of ion species for irradiation, and each set of mass analysis slits is integrally composed of three slits including a slit for normal implantation, a slit for high mass resolution and low-dose implantation, and a plate for beam centering with a small-diameter opening, said three slits are switchable therebetween depending on the normal implantation, the high resolution and low-dose implantation, and the beam centering, and each set of mass analysis slits is movable horizontally between a mass analysis position and a retreat position and is further movable longitudinally so that said mass analysis position becomes substantially the same for all ion species.

12. An irradiation system with ion beam according to claim 1 or 11, wherein said beam is modified by the beam transformer in its cross-sectional shape from a circular cross-section or an elliptical or oval cross-section to an elliptical or oval cross-section that is long in a scan direction after deflection for scanning.

13. An irradiation system with ion beam according to claim 1 or 11, wherein said beam is modified by the beam transformer in its cross-sectional shape from a circular cross-section or an elliptical or oval cross-section to an elliptical or oval cross-section that is long in a scan direction after deflection for scanning, and a plurality of apertures and electrodes provided in the beam line downstream of said deflector for scanning are made of graphite, and intervals between said plurality of apertures and between said electrodes are set narrow so as to prevent said beam from hitting directly on side walls of vacuum chambers in the beam line and said deflector for scanning.

* * * * *

UNITED STATES PATENT AND TRADEMARK OFFICE
CERTIFICATE OF CORRECTION

PATENT NO. : 7,351,987 B2  Page 1 of 1
APPLICATION NO. : 11/202100
DATED : April 1, 2008
INVENTOR(S) : Mitsuaki Kabasawa et al.

It is certified that error appears in the above-identified patent and that said Letters Patent is hereby corrected as shown below:

Title Page -

In (73) Assignee, please correct to read as follows:

-- (73) Assignee: SEN Corporation, an SHI and Axcelis Company --.

Signed and Sealed this

Twenty-third Day of September, 2008

JON W. DUDAS
*Director of the United States Patent and Trademark Office*